(12) United States Patent
Kao et al.

(10) Patent No.: US 12,283,564 B2
(45) Date of Patent: Apr. 22, 2025

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Min-Feng Kao, Chiayi (TW); Dun-Nian Yaung, Taipei (TW); Jen-Cheng Liu, Hsin-Chu (TW); Hsing-Chih Lin, Tainan (TW); Zheng-Xun Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/352,270

(22) Filed: Jul. 14, 2023

(65) Prior Publication Data

US 2023/0361075 A1 Nov. 9, 2023

Related U.S. Application Data

(63) Continuation of application No. 17/226,081, filed on Apr. 9, 2021, now Pat. No. 11,756,920.

(51) Int. Cl.
*H01L 23/00* (2006.01)
*H01L 21/768* (2006.01)
(Continued)

(52) U.S. Cl.
CPC ........ *H01L 24/80* (2013.01); *H01L 21/76898* (2013.01); *H01L 23/481* (2013.01);
(Continued)

(58) Field of Classification Search
CPC ............. H01L 21/76898; H01L 23/481; H01L 23/5226; H01L 23/6283; H01L 24/80;
(Continued)

(56) References Cited

U.S. PATENT DOCUMENTS 8,993,380 B2 3/2015 Hou et al.
9,281,254 B2 3/2016 Yu et al.
(Continued)

*Primary Examiner* — Jasmine J Clark
(74) *Attorney, Agent, or Firm* — JCIPRNET

(57) ABSTRACT

A semiconductor structure and a manufacturing method thereof are provided. A semiconductor structure includes top, bottom, and middle tiers. The bottom tier includes a first interconnect structure overlying a first semiconductor substrate, and a first front-side bonding structure overlying the first interconnect structure. The middle tier interposed between and electrically coupled to the top and bottom tiers includes a second interconnect structure overlying a second semiconductor substrate, a second front-side bonding structure interposed between the top tier and the second interconnect structure, and a back-side bonding structure interposed between the second semiconductor substrate and the first front-side bonding structure. A bonding feature of the second front-side bonding structure includes a first bonding via in contact with the second interconnect structure, a first bonding contact overlying the first bonding via, and a barrier layer interface between a bottom of the first bonding contact and a top of the first bonding via.

20 Claims, 30 Drawing Sheets

(51) Int. Cl.
*H01L 23/48* (2006.01)
*H01L 23/522* (2006.01)
*H01L 23/528* (2006.01)
*H01L 25/00* (2006.01)
*H01L 25/065* (2023.01)

(52) U.S. Cl.
CPC ...... *H01L 23/5226* (2013.01); *H01L 23/5283* (2013.01); *H01L 24/08* (2013.01); *H01L 24/32* (2013.01); *H01L 25/0657* (2013.01); *H01L 25/50* (2013.01); *H01L 2224/08146* (2013.01); *H01L 2224/32146* (2013.01); *H01L 2224/8038* (2013.01); *H01L 2224/80894* (2013.01); *H01L 2225/06544* (2013.01)

(58) Field of Classification Search
CPC ..... H01L 24/08; H01L 24/32; H01L 25/0657; H01L 25/50; H10B 80/00
USPC ................................ 257/734, 777, 781, 784
See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2017/0200756 A1* | 7/2017 | Kao .................. H01L 27/14636 |
| 2022/0157785 A1* | 5/2022 | Yu ............................ H01L 24/81 |

* cited by examiner

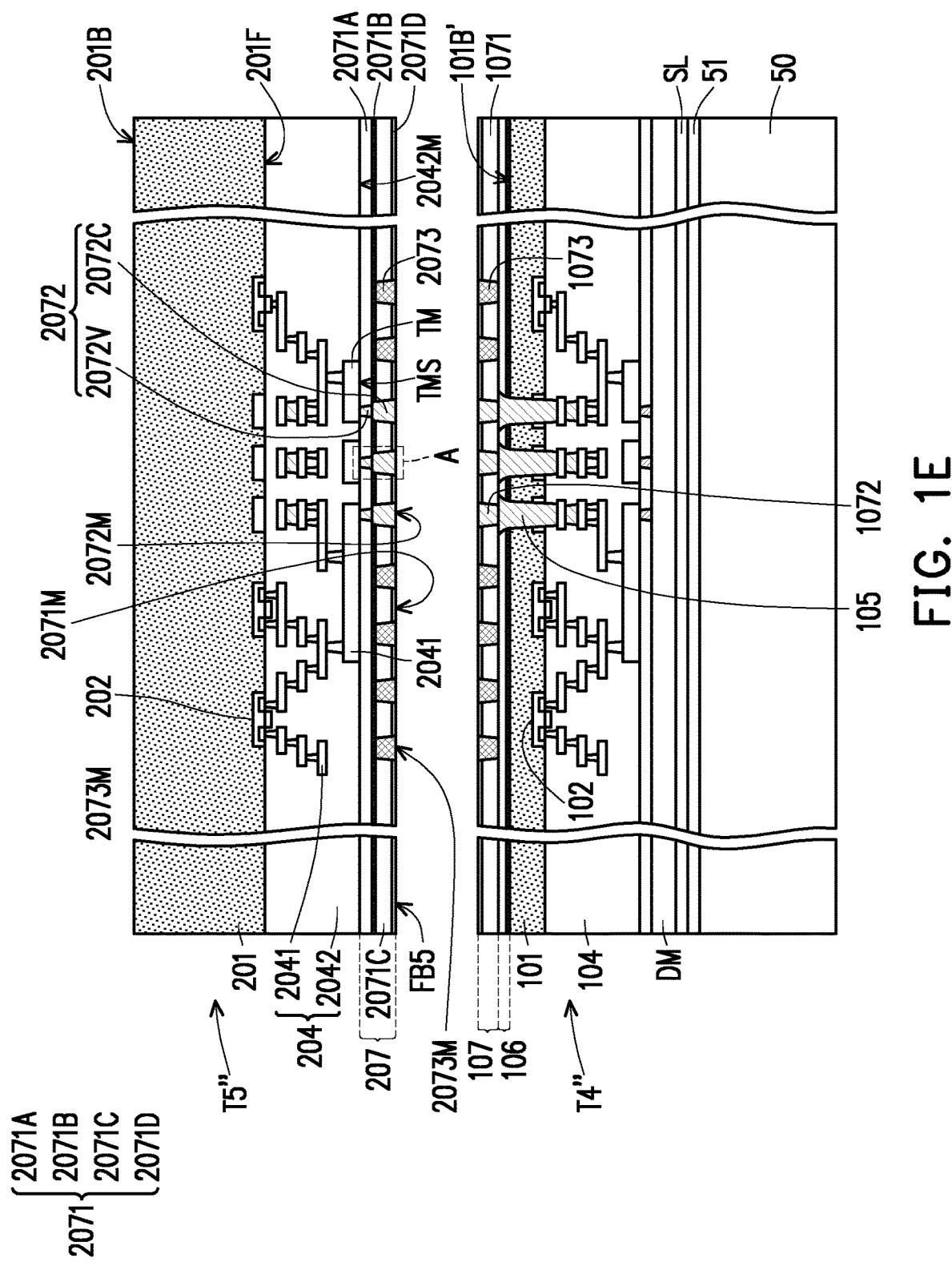

SEMICONDUCTOR STRUCTURE AND MANUFACTURING METHOD THEREOF

CROSS-REFERENCE TO RELATED APPLICATION

This application is a continuation application of and claims the priority benefit of a prior application Ser. No. 17/226,081, filed on Apr. 9, 2021, now U.S. Pat. No. 11,756,920. The entirety of the above-mentioned patent application is hereby incorporated by reference herein and made a part of this specification.

BACKGROUND

The semiconductor industry has experienced rapid growth due to continuous improvement in integration density of various components, e.g., transistors, diodes, resistors, capacitors, etc. For the most part, this improvement in integration density has come from successive reductions in minimum feature size, which allows more components to be integrated into a given area. However, process limitations have made it difficult to continue shrinking the minimum feature size. In an attempt to further increase circuit density, three-dimensional (3D) integrated circuits (ICs) including a plurality of IC dies stacked on and bonded to one another have been investigated. As more and more IC dies bonded together, stacking and bonding technologies for forming reliable semiconductor structures face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1J are schematic cross-sectional views showing various stages in a manufacturing method of a semiconductor structure including a front-to-back bonding interface according to some embodiments.

DETAILED DESCRIPTION

Figure 1A:
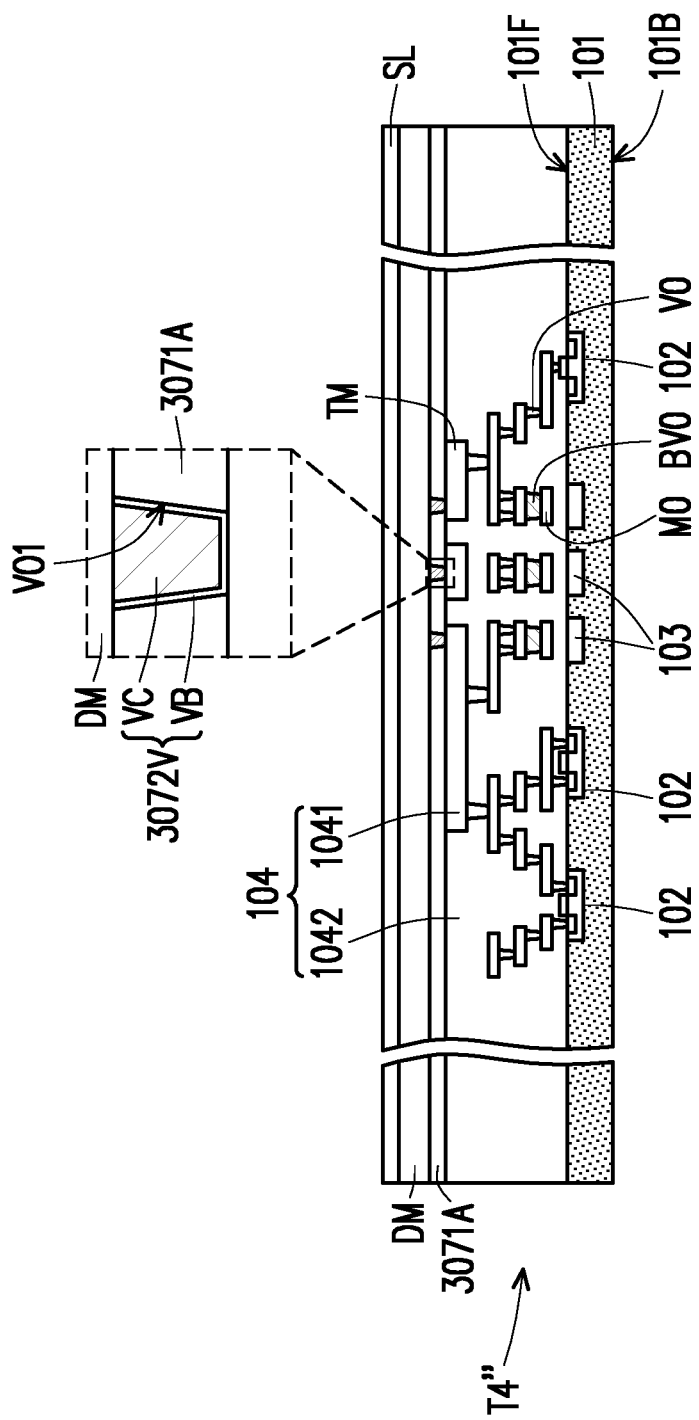

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
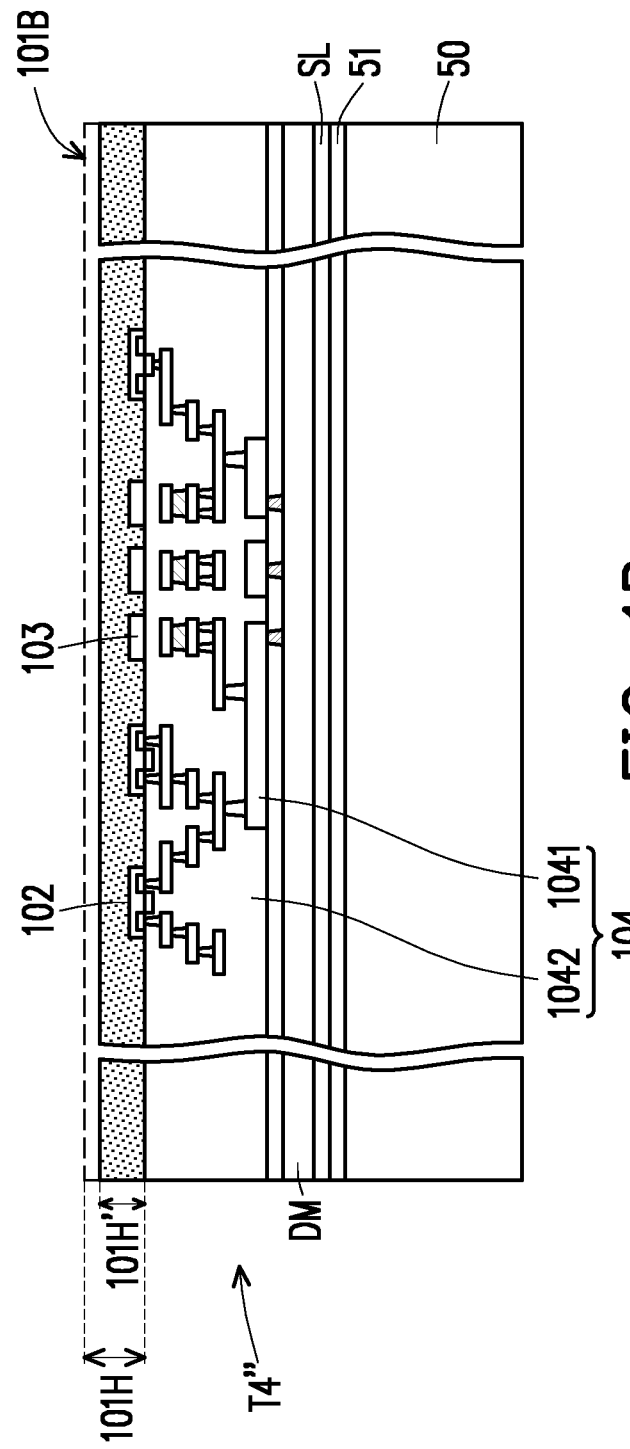
Figure 1C:
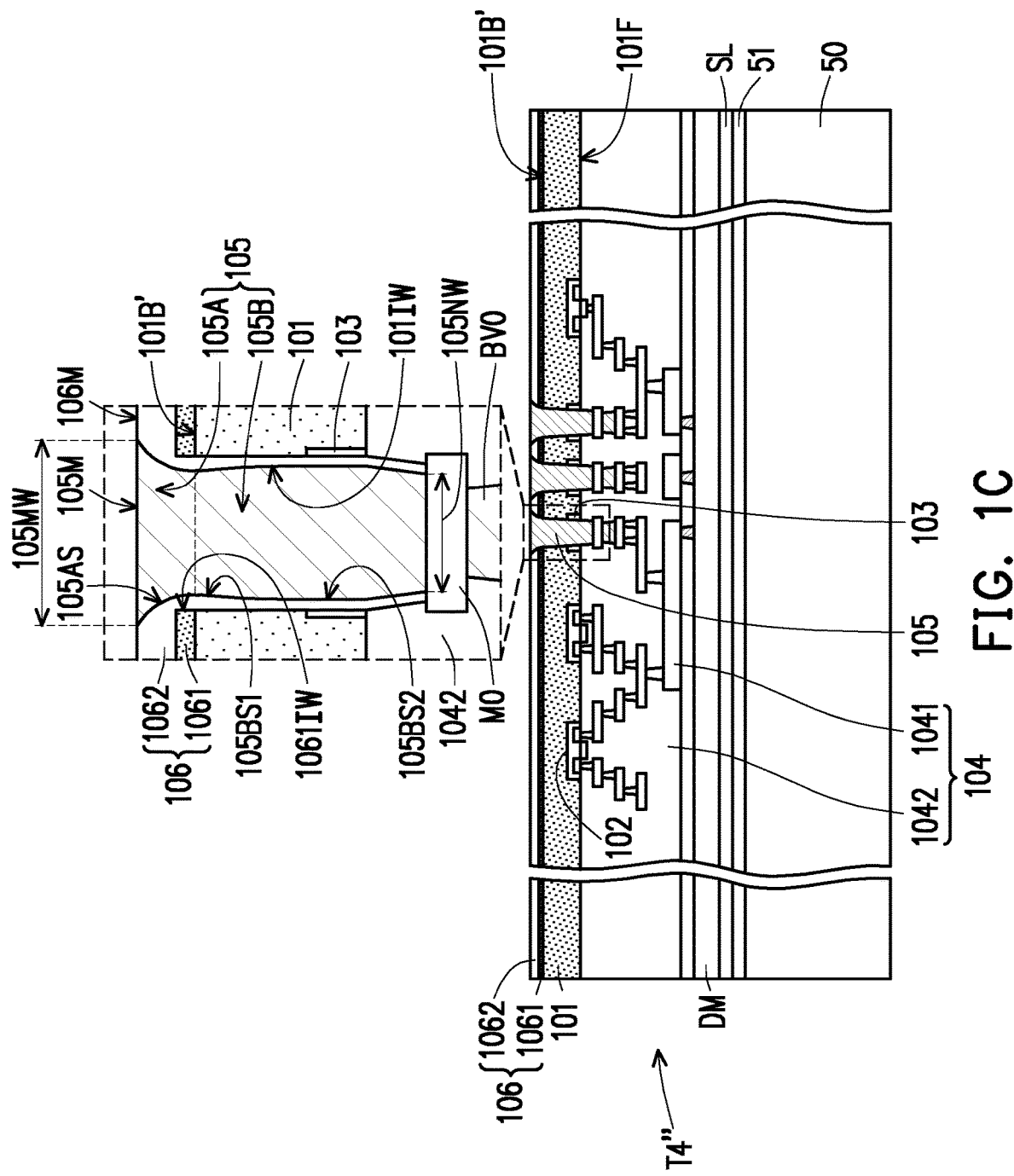
Figure 1D:
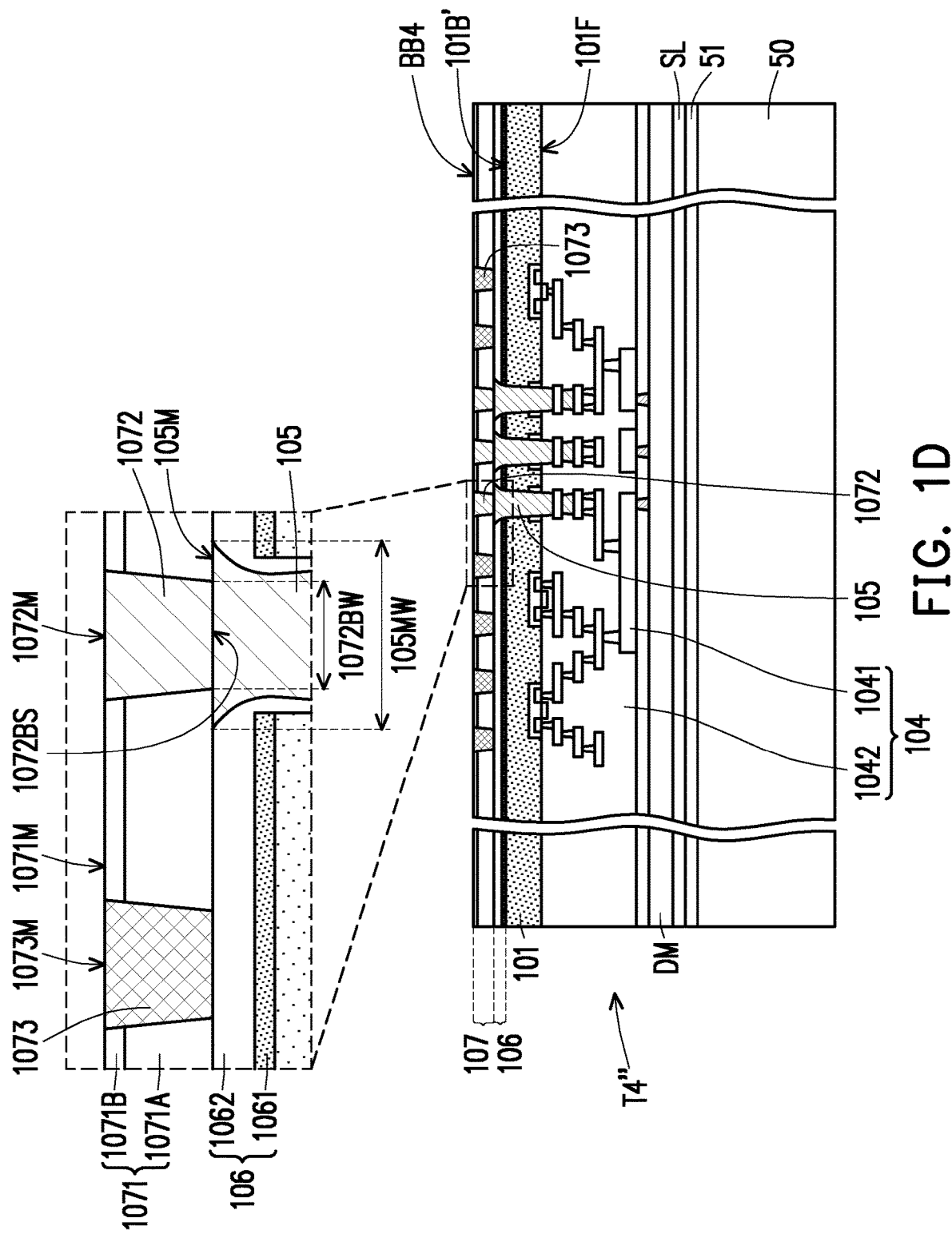
Figure 1F:
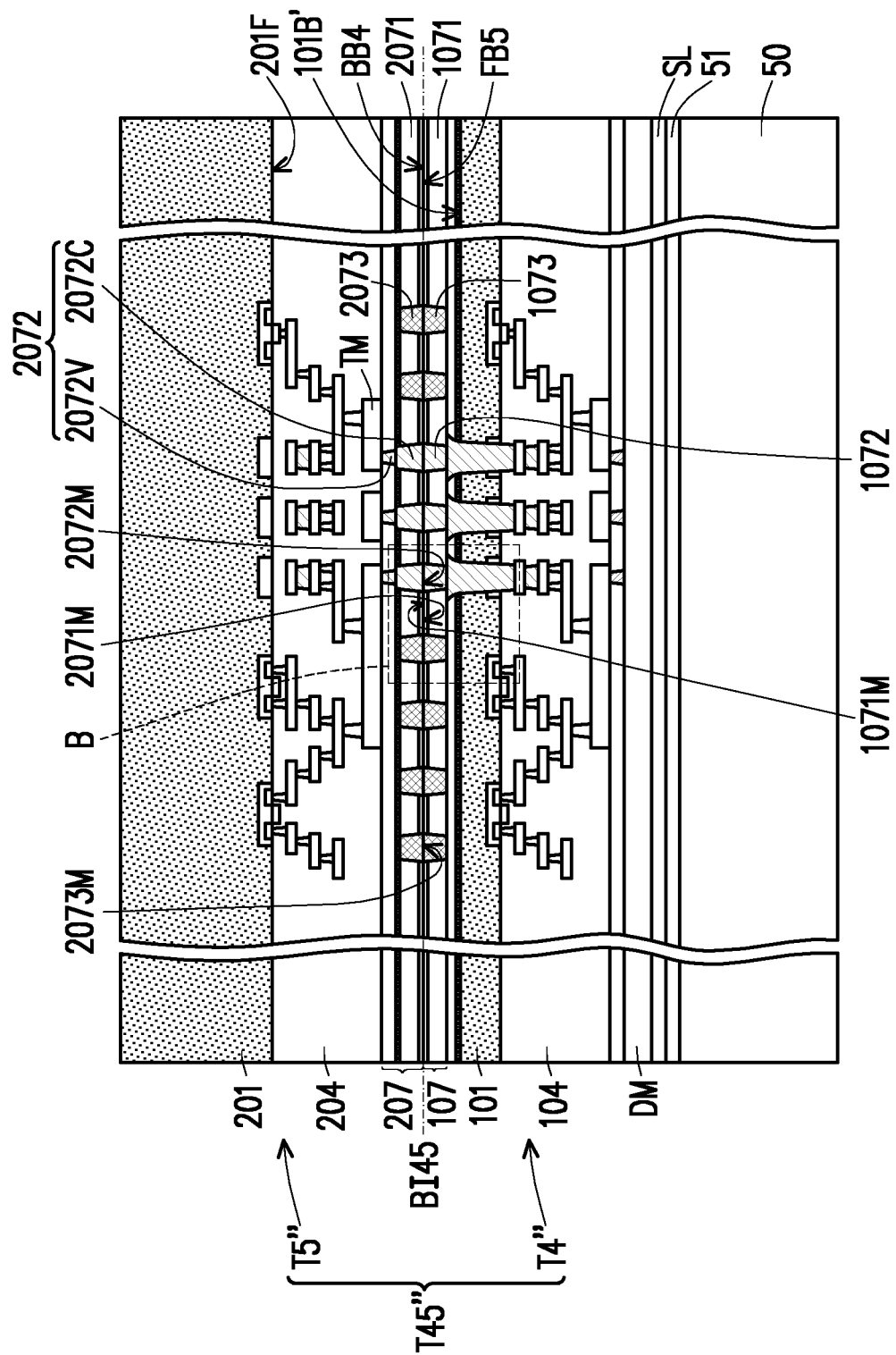
Figure 1G:
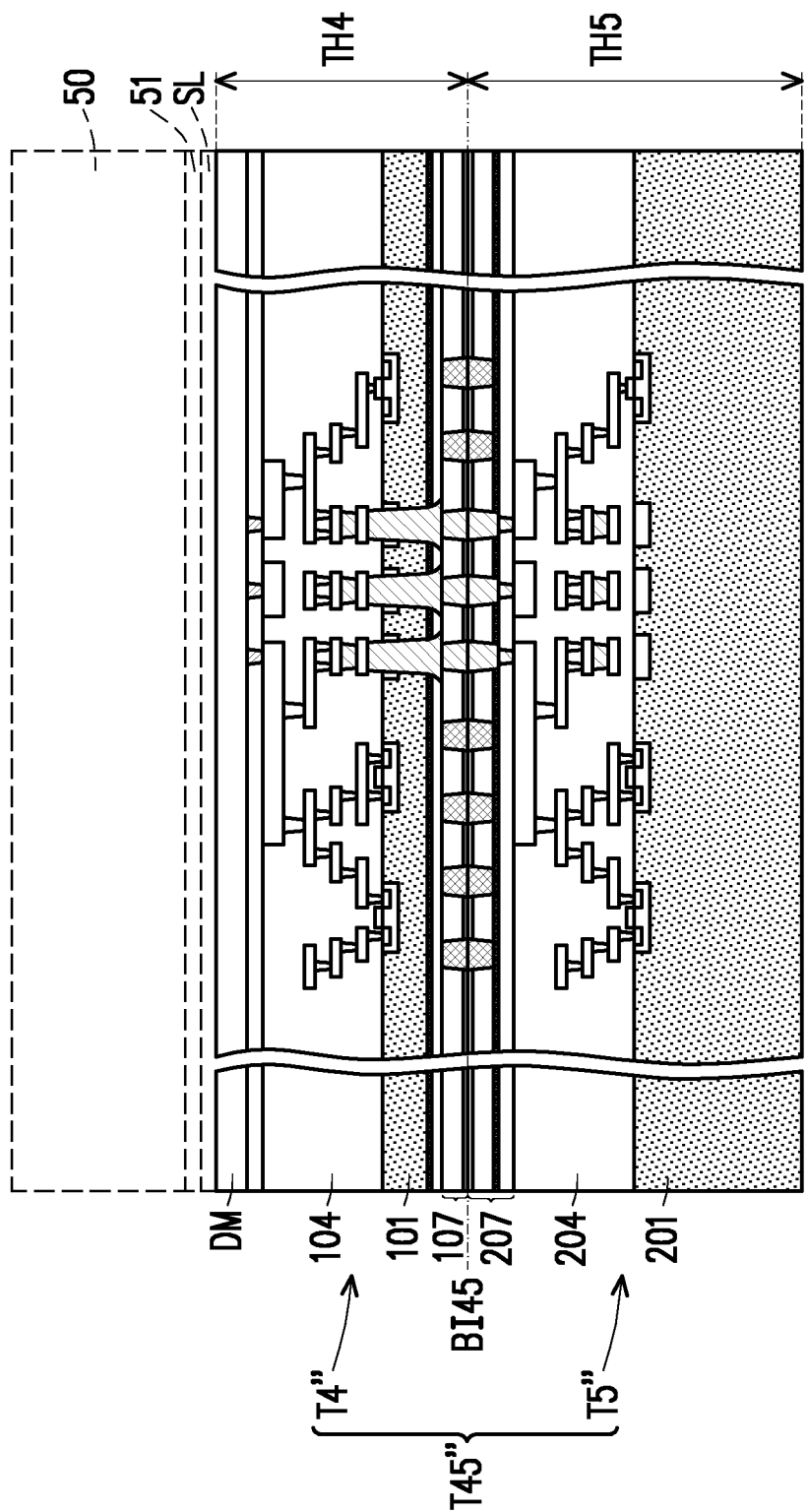
Figure 1H:
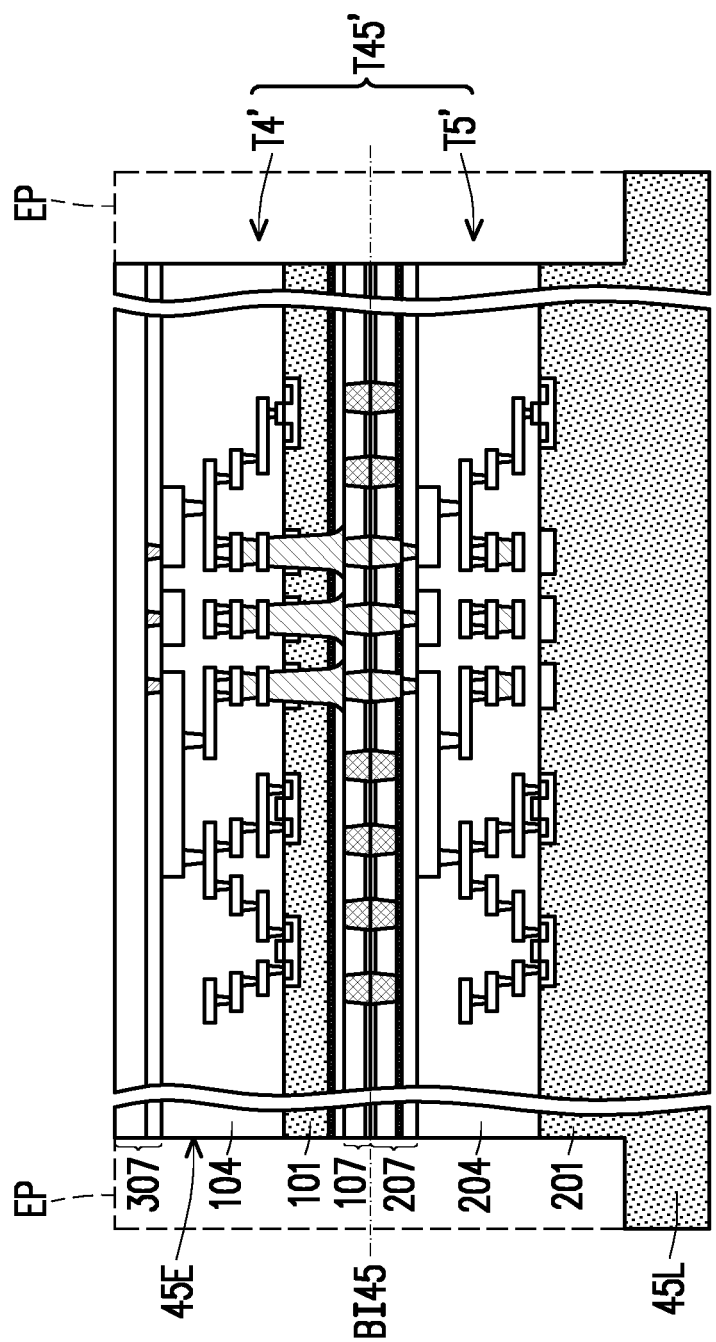
Figure 11:
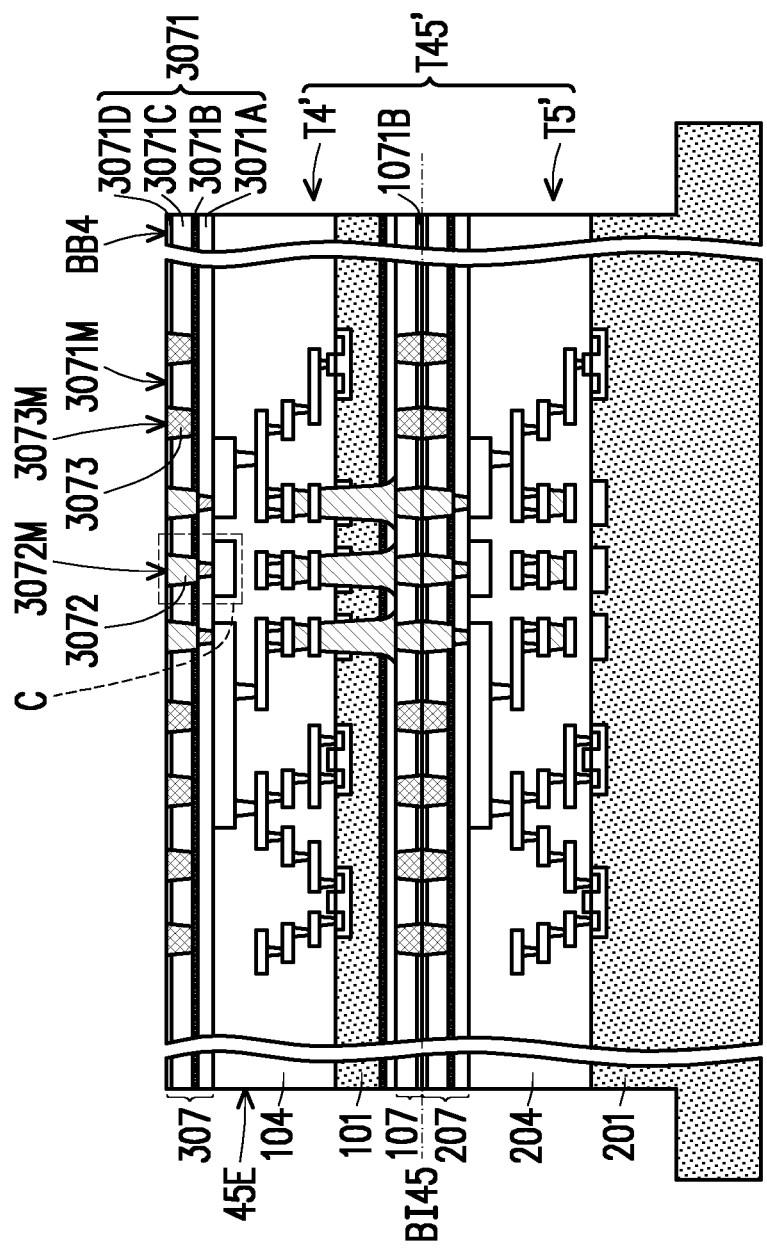
Figure 1J:
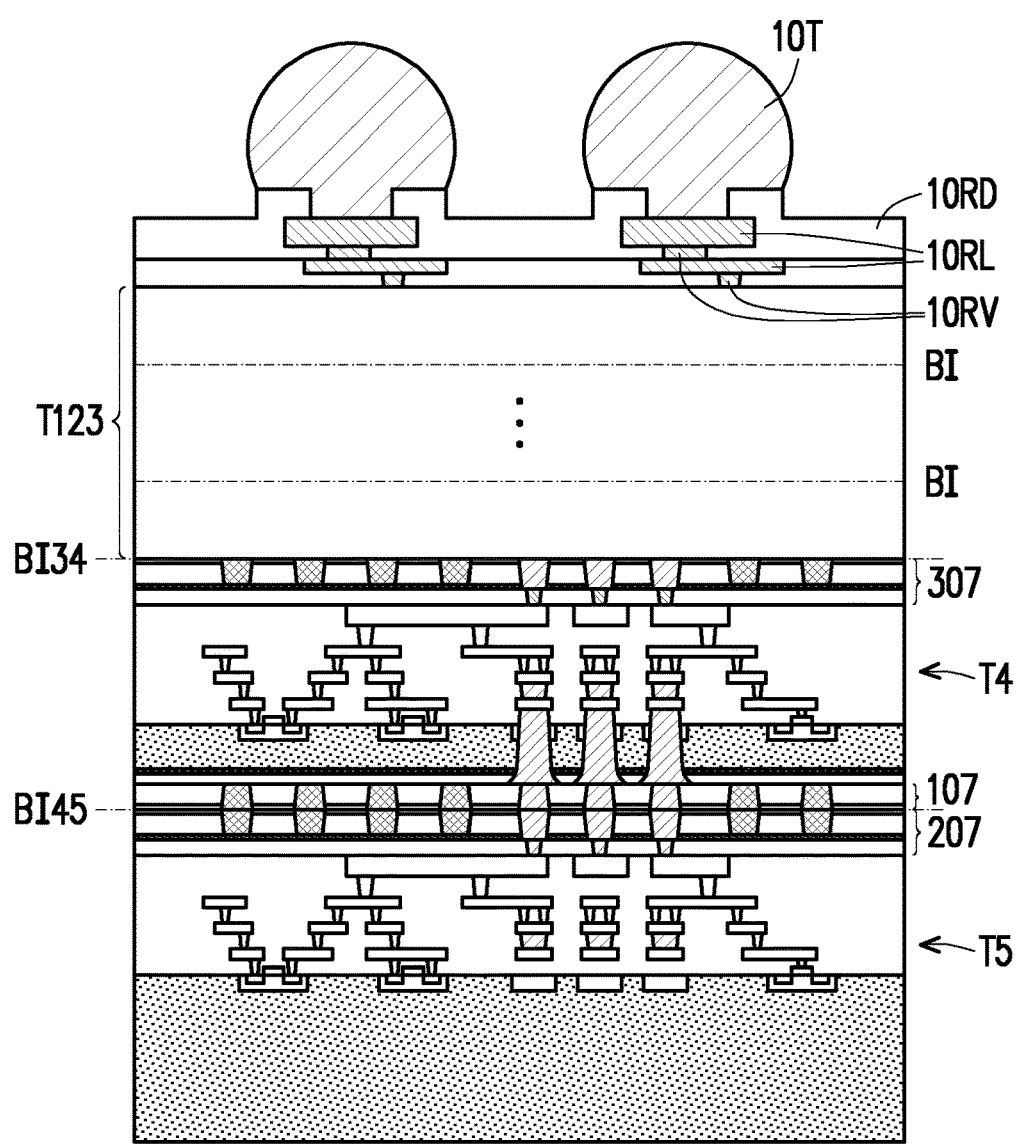
Figure 2A:
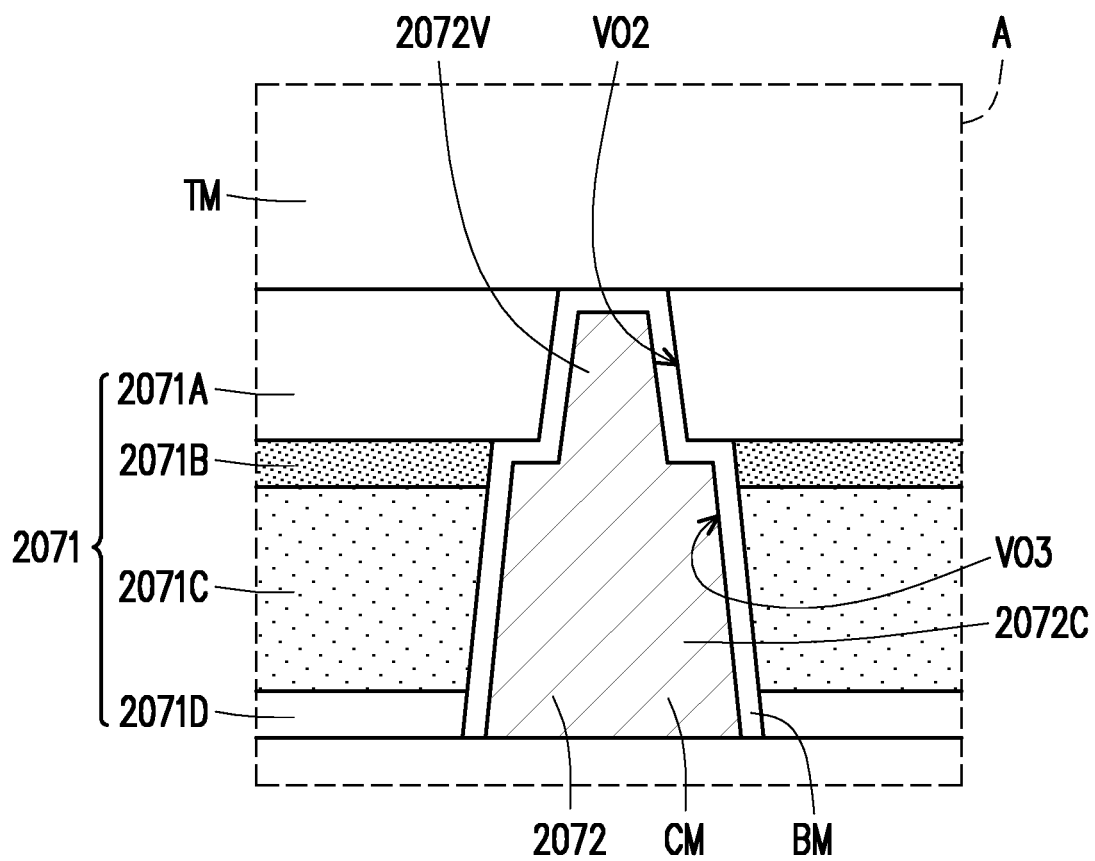
FIG. 2A is a schematic and enlarged cross-sectional view showing a dashed box A outlined in FIG. 1E according to some embodiments.
Figure 2B:
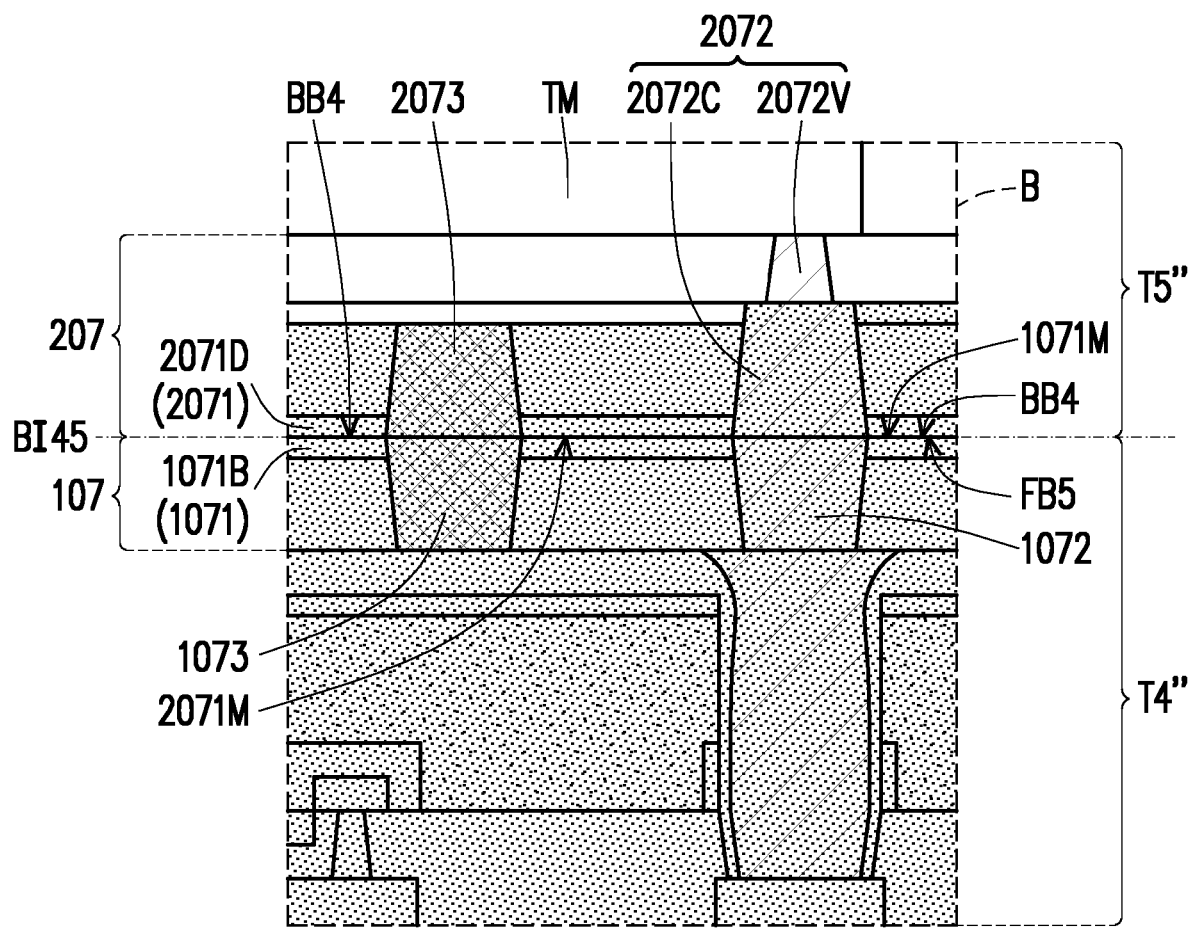
FIG. 2B is a schematic and enlarged cross-sectional view showing a dashed box B outlined in FIG. 1F according to some embodiments.
Figure 2C:
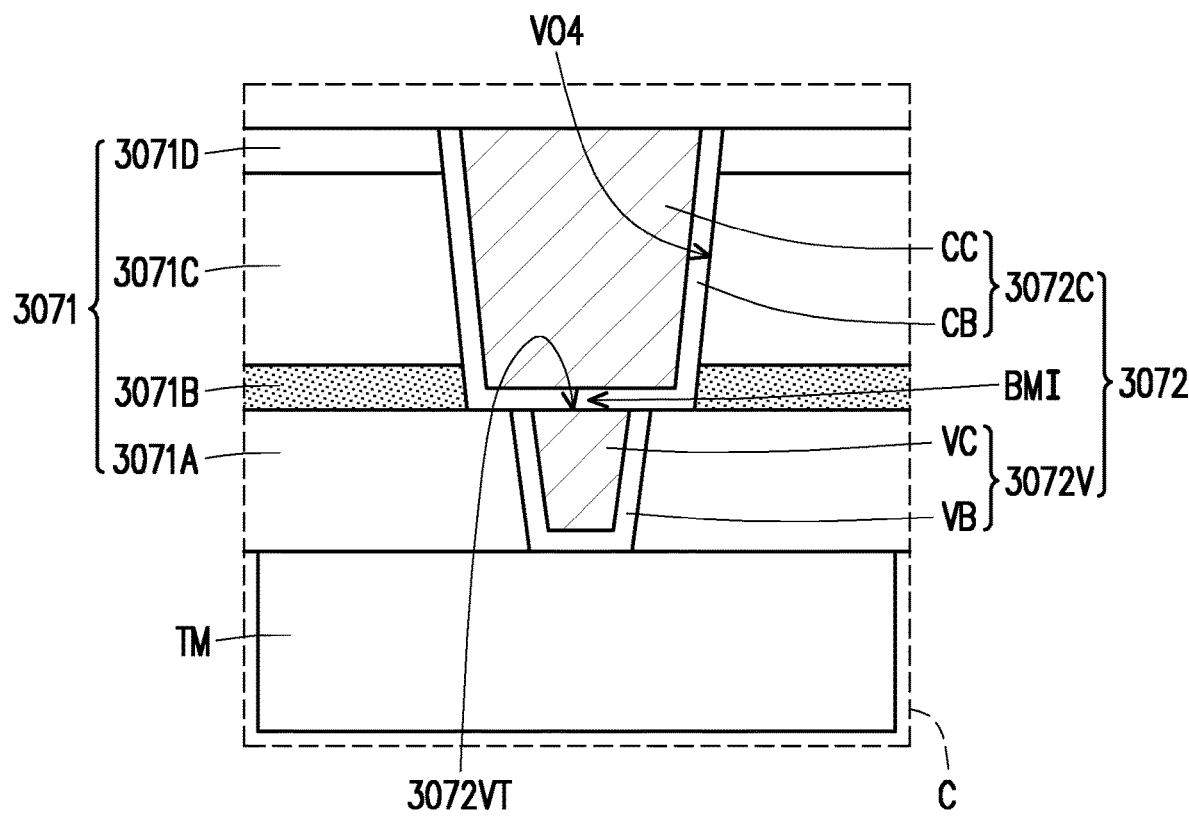
FIG. 2C is a schematic and enlarged cross-sectional view showing a dashed box C outlined in FIG. 1I according to some embodiments.

FIGS. 1A-1J are schematic cross-sectional views showing various stages in a manufacturing method of a semiconductor structure including a front-to-back bonding interface according to some embodiments, FIG. 2A is a schematic and enlarged cross-sectional view showing a dashed box A outlined in FIG. 1E according to some embodiments, FIG. 2B is a schematic and enlarged cross-sectional view showing a dashed box B outlined in FIG. 1F according to some embodiments, and FIG. 2C is a schematic and enlarged cross-sectional view showing a dashed box C outlined in FIG. 1I according to some embodiments. It should be understood that the discussed process steps performed at wafer level are merely examples and are not intended to be limiting.

Referring to FIG. 1A, a semiconductor wafer T4" is provided. In some embodiments, the semiconductor wafer T4" includes a semiconductor substrate 101 having a front-side 101F and a back-side 101B. The material(s) of the semiconductor substrate 101 may be (or include) elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable material(s). In some embodiments, the semiconductor substrate 101 includes multi-layer semiconductors, semiconductor-on-insulator (SOI) (e.g., silicon on insulator or germanium on insulator), and/or the like.

In some embodiments, a plurality of semiconductor devices 102 (e.g., transistors, diodes, resistors, capacitors, etc.) may be arranged at the front-side 101F of the semiconductor substrate 101. The semiconductor devices 102 may be formed using front-end of line (FEOL) fabrication techniques. A plurality of isolation regions 103 may be formed at the front-side 101F of the semiconductor substrate 101 to electrically isolate neighboring regions from one another. The isolation regions 103 may be or may include a dielectric material (e.g., silicon oxide, silicon nitride, silicon oxynitride, fluoride-doped silicate glass, a combination thereof, and/or the like). In some embodiments, the isolation regions 103 are referred to as shallow trench isolator (STI). It should be appreciated that the semiconductor devices 102 and the isolation regions 103 are shown for illustrative purposes only, and locations and number of the semiconductor devices 102 and the isolation regions 103 construe no limitation in the disclosure. Alternatively, the isolation regions 103 are omitted.

With continued reference to FIG. 1A, an interconnect structure 104 is disposed over the front-side 101F of the semiconductor substrate 101. The interconnect structure 104 may be formed using back-end of line (BEOL) fabrication techniques and may be electrically coupled to the semiconductor devices 102. For example, an inter-layer dielectric (ILD) layer is formed over the front-side 101F to cover the semiconductor devices 102, and any number of inter-metal dielectric (IMD) layer including metal patterns and vias is formed over the ILD layer. In some embodiments, the interconnect structure 104 includes a plurality of interconnect layers 1041 embedded in a dielectric layer 1042. The dielectric layer 1042 may include one or more of an oxide, an ultra-low-k dielectric material, a low-k dielectric material, and/or the like. The interconnect layers 1041 may include conductive material(s) such as copper, aluminum, tungsten, a combination thereof, and/or the like. The interconnect layers 1041 may include a plurality of metal patterns (e.g., pads and lines) and metal vias alternatingly stacked in the dielectric layer 1042. In some embodiments, the interconnect layers 1041 include dummy metal patterns (not shown) embedded in the dielectric layer 1042 and disposed next to the metal patterns.

In some embodiments, the metal patterns may increase in size as a distance from the semiconductor substrate 101 increases. For example, the metal pattern MO at the bottom level (e.g., close to the semiconductor substrate 101) is thinner than the metal pattern TM at the top level (e.g., away from the semiconductor substrate 101). The metal vias may also increase in size as a distance from the semiconductor substrate 101 increases. In some embodiments, some of the metal vias located at the same level have different sizes. For example, the dimension of the metal via BV0 formed on the metal pattern MO is greater than that of the metal via VO formed at the same level. Alternatively, the metal vias (BV0 and VO) are of the similar dimension. The metal via BV0 and the underlying metal pattern MO may correspond to the isolation region 103 for connecting the subsequently formed through substrate via. The metal vias may be tapered and gradually become narrower along a thickness direction extending from the front-side 101F to the back-side 101B. Alternatively, the metal vias may have substantially vertical sidewalls.

Still referring to FIG. 1A, a plurality of bonding vias 3072V may be formed on the metal patterns TM at the top level of the interconnect layers 1041, in accordance with some embodiments. In some embodiments, the bonding vias 3072V are covered by a first dielectric sublayer 3071A overlying the dielectric layer 1042. The respective bonding via 3072V may include a conductive material VC and a barrier material VB lining the conductive material VC. The barrier material VB may separate the conductive material VC from the first dielectric sublayer 3071A. In some embodiments, the material of the first dielectric sublayer 3071A is similar to the underlying dielectric layer 1042. In some embodiments, the material of the first dielectric sublayer 3071A may include oxide material (e.g., silicon oxide), nitride material (e.g., silicon nitride), other suitable materials (e.g., silicon carbide, silicon oxynitride, etc.), and/or the like. The conductive material VC may include copper or copper alloy, although other suitable conductive materials such as aluminum, gold, silver, combinations thereof, and the like, may alternatively be utilized. The barrier material VB may be conductive and interposed between the metal patterns TM and the overlying conductive material VC and between the conductive material VC and the first dielectric sublayer 3071A. For example, the barrier material VB includes, but not limited to, tantalum (Ta), tantalum nitride (TaN), titanium (Ti), titanium nitride (TiN), aluminum nitride (AlN), a combination thereof, etc.

With continued reference to the enlarged view in FIG. 1A, the formation of the bonding vias 3072V may include at least the following steps. For example, a plurality of via openings VO1 is formed in the first dielectric sublayer 3071A to accessibly reveal at least portions of the metal patterns TM using lithography and etching process or other suitable techniques. Next, the barrier material VB may be formed on the inner sidewalls of the first dielectric sublayer 3071A that define the respective via opening VO1 and also formed on the portions of the metal patterns TM that are accessibly revealed by the via openings VO1 so as to line the via openings VO1. The conductive material VC may subsequently be formed on the barrier material VB to fill the via openings VO1. In some embodiments, a seed material (not shown) is deposited on the barrier material VB to assist the formation of the conductive material VC. Subsequently, the conductive material VC and the underlying barrier material VB that are outside the via openings VO1 may be removed by, e.g., a chemical-mechanical polishing (CMP) process, an etching process, or any suitable technique. It should be noted that the barrier material and the seed material of the bonding via 3072V are eliminated from the other drawings for ease of illustration.

In some embodiments, the bonding vias 3072V are part of bonding features, and the first dielectric sublayer 3071A covering the bonding vias 3072V is part of a bonding dielectric layer (e.g., referring to FIG. 1I). Alternatively, the bonding vias 3072V are not formed at this stage and may be formed after bonding the semiconductor wafer T4" to another wafer. After forming the bonding vias 3072V, a dielectric material DM may be formed on the first dielectric sublayer 3071A to cover the bonding vias 3072V. The dielectric material DM may be a single layer or may include a plurality of sublayers. In some embodiments, the dielectric material DM includes multiple sublayers that will be formed as the bonding dielectric layer in the subsequent process. It should be noted that the dielectric material DM shown herein is merely an example, and the number of the sublayer of the dielectric material DM construes no limitation in the disclosure. The bonding vias 3072V may be buried in the dielectric materials (e.g., DM and 3071A) at this stage. In some embodiments, a sacrificial layer SL is formed on the dielectric material DM for protection and may be removed in the following step. The sacrificial layer SL may be made of polymer including silicon oxynitride, silicon nitride, and/or the like. Alternatively, the sacrificial layer SL and/or the dielectric material DM may be omitted.

Referring to FIG. 1B and with continued reference to FIG. 1A, the semiconductor wafer T4" may be attached to a temporary carrier 50 and the semiconductor substrate 101 may be thinned. In some embodiments, after attaching the semiconductor wafer T4" to the temporary carrier 50, the interconnect structure 104 faces the temporary carrier 50 and the back-side 101B of the semiconductor substrate 101 faces upwardly for back-side processing. A material of the temporary carrier 50 may include glass, metal, ceramic, silicon, plastic, combinations thereof, multi-layers thereof, or other suitable material that can provide structural support for the semiconductor wafer T4" in subsequent processing. In some embodiments, attaching the semiconductor wafer T4" to the temporary carrier 50 includes bonding the sacrificial layer SL to a temporary adhesive layer 51 formed on the temporary carrier 50. The temporary adhesive layer 51 may be or may include a polymer layer, a ultra-violet cured layer, and/or other suitable temporary adhesives. Alternatively, the temporary adhesive layer 51 is omitted.

In some embodiments, after bonding the semiconductor wafer T4" to the temporary carrier 50, the back-side 101B of the semiconductor substrate 101 is subjected to the thinning process (e.g., CMP, grinding, etching, a combination thereof, and/or another applicable process). In some embodiments, the thickness of the semiconductor substrate 101 is reduced from a thickness 101H of over 700 µm to a thickness 101H' in a range of between approximately 0.5 µm and 10 µm. The thinning of the semiconductor substrate 101 may serve to reduce the length of the subsequently-formed through substrate vias that electrically connect the interconnect layers 1041, thereby enhancing performance.

Referring to FIG. 1C, a plurality of back-side through substrate vias (BTSVs) 105 may be formed to be electrically coupled to the interconnect structure 104. In some embodiments, the BTSVs 105 land on the metal patterns MO that are directly connected to the metal vias BV0. In some embodiments, the formation of the BTSVs 105 includes forming a seed material layer (e.g., TiN/Cu, TaN/Cu, or the like) and then plating a conductive material layer (e.g., copper, aluminum, alloys, combinations thereof, and/or the like) on the seed material layer. In some embodiments in which the isolation regions 103 are formed at the front-side 101F, each of the BTSVs 105 penetrates the semiconductor substrate 101 and goes through one of the isolation regions 103 as well to further extend into the dielectric layer 1042 to land on the metal pattern MO. It should be understood that the BTSVs 105 may be physically connected to the metal patterns at any level, depending on the circuit design, and other configuration of the BTSVs 105 is possible.

In some embodiments, before forming the BTSVs 105, a dielectric layer 106 is formed on the thinned back-side 101B' of the semiconductor substrate 101 to laterally cover the subsequently-formed BTSVs 105. For example, a first dielectric sublayer 1061 is deposited on the thinned back-side 101B', and then a second dielectric sublayer 1062 may be formed on the first dielectric sublayer 1061, where the first dielectric sublayer 1061 and the second dielectric sublayer 1062 are of different insulating materials. For example, the first dielectric sublayer 1061 may include aluminum oxide, titanium oxide, tantalum oxide, hafnium oxide, zirconium oxide, and/or the like, and the second dielectric sublayer 1062 may include silicon oxide, silicon nitride, silicon carbide, silicon oxynitride, and/or other suitable materials. It is noted that two sublayers of the dielectric layer 106 is shown for illustrative purposes only, and the dielectric layer 106 may be a single layer or more than two sublayers.

In some embodiments, a portion of the second dielectric sublayer 1062 extends along the inner sidewall 1061IW of the underlying first dielectric sublayer 1061 to the respective through hole of the semiconductor substrate 101 for separating the subsequently-formed BTSV 105 from the semiconductor substrate 101. The portion of the second dielectric sublayer 1062 covering the inner sidewalls 101IW of the semiconductor substrate 101 may serve as a dielectric barrier liner to prevent the conductive material (e.g., copper) of the subsequently-formed BTSV 105 from diffusing into the semiconductor substrate 101.

With continued to reference to FIG. 1C, at least a portion of the respective BTSV 105 may be accessibly exposed by the dielectric layer 106. For example, the major surfaces 105M of the BTSVs 105 are substantially leveled with the major surface 106M of the dielectric layer 106 (e.g., the top surface of the second dielectric sublayer 1062). The lateral dimension (e.g., width or diameter) 105MW of the major surface 105M of the respective BTSV 105 may range from about 0.05 µm to about 10 µm. The lateral dimension 105MW may be greater than the lateral dimension 105NW of the bottom surface connected to the metal pattern. In some embodiments, the respective BTSV 105 includes a first portion 105A and a second portion 105B connected to the first portion 105A, where the first portion 105A protrudes from the thinned back-side 1B' of the semiconductor substrate 101, and the second dielectric sublayer 1062 is interposed between the second portion 105B and the semiconductor substrate 101.

In some embodiments, the first portion 105A has tapered sidewalls 105AS which cause a lateral dimension (e.g., width or diameter) of the first portion 105A to decrease from the dielectric layer 106 to the thinned back-side 11B' of the semiconductor substrate 101. In some embodiments, the lateral dimension of the first portion 105A tapers inwardly by a varied slope from the lateral dimension 105MW of the major surface 105M to a lateral dimension of a virtual surface which is on a plane where the thinned back-side 11B' is located. In some embodiments, the tapered sidewalls 105AS have a continuous curved shape seen from the cross-sectional view. Alternatively, the tapered sidewalls 105AS of the first portion 105A have, but not limited to, a geometric polygonal shape seen from the cross-sectional view. The second portion 105B may have upper sidewalls 105BS1 connected to the tapered sidewalls 105AS and lower sidewalls 105BS2 connected to the upper sidewalls 105BS1. In some embodiments, the portion of the second dielectric sublayer 1062 covering the upper sidewalls 105BS1 is thicker than the portion of the second dielectric sublayer 1062 covering the lower sidewalls 105BS2. For example, the lateral dimension of the upper part (e.g., corresponding to the upper sidewalls 105BS1) of the second portion 105B is substantially less than that of the lower part (e.g., corresponding to the lower sidewalls 105BS2) of the second portion 105B, where the lateral dimension of the lower part is substantially less than the lateral dimension 105MW of the first portion 105A. It should be noted that the BTSVs 105 are illustrated in a simplified manner and the portion of the second dielectric sublayer 1062 interposed between the BTSV 105 and the semiconductor substrate 101 is eliminated from the other drawings for ease of illustration.

Referring to FIG. 1D, a back-side bonding structure 107 may be formed on the dielectric layer 106 and the BTSVs 105. For example, the back-side bonding structure 107 includes a bonding dielectric layer 1071 and a plurality of bonding features 1072 laterally covered by the bonding dielectric layer 1071, where the bonding features 1072 are in physical and electrical contact with the BTSVs 105. The bonding dielectric layer 1071 may include a single dielectric material or may include more than one dielectric sublayer. For example, a dielectric sublayer 1071A is formed on the dielectric layer 106, and a bonding film 1071B is formed on the dielectric sublayer 1071A. The materials of the dielectric sublayer 1071A and the bonding film 1071B may be or may include silicon oxide, silicon oxynitride, silicon nitride, borosilicate glass (BSG), phosphoric silicate glass (PSG), borophosphosilicate glass (BPSG), fluorinated silicate glass (FSG), a combination thereof, and/or any suitable dielectric material. In some embodiments, the dielectric sublayer 1071A and the bonding film 1071B are of different materials. It is noted that the bonding dielectric layer 1071 including two sublayers is shown for illustrative purposes only, and the number of the sublayers construes no limitation in the disclosure.

The bonding features 1072 of the back-side bonding structure 107 may be formed through any suitable formation process (e.g., lithography and etching, damascene, or the like) and may be formed using suitable conductive material(s) such as copper, aluminum, metal alloys, a combination thereof, and/or the like. In some embodiments, the formation of the bonding features 1072 involves a single damascene process, where one metal layer is formed at a time. For example, a plurality of holes is formed in the bonding dielectric layer 1071 using a patterned mask layer (not shown; e.g., photoresist), where the patterned mask layer is formed on the bonding dielectric layer 1071 and has openings that define holes. Next, the holes of the bonding dielectric layer 1071 may be filled with conductive materials, and then a planarization process (e.g., CMP, grinding, etching, etc.) is performed to remove excess of materials from the major surface 1071M of the bonding dielectric layer 1071 so as to form the bonding features 1072.

In some embodiments, the major surfaces 1072M of the bonding features 1072 are accessibly exposed by the bonding dielectric layer 1071 and may be substantially leveled with the major surface 1071M of the bonding dielectric layer 1071 (e.g., the top surface of the bonding film 1071B). In some embodiments, the respective bonding feature 1072 has sidewalls tilted in a thickness direction from the bonding film 1071B to the dielectric sublayer 1071A. Alternatively, the bonding features 1072 have substantially vertical sidewalls. In some embodiments, the respective bonding feature 1072 has a top portion laterally covered by the bonding film 1071B and a bottom portion laterally covered by the dielectric sublayer 1071A.

With continued reference to FIG. 1D, the bonding features 1072 are electrically coupled to the semiconductor devices 102 through the BTSVs 105 and the interconnect structure 104. For example, the bottom surface 1072BS of the respective bonding feature 1072 may be in physical contact with the major surface 105M of the corresponding BTSV 105. In some embodiments, the bottom surface 1072BS of the respective bonding feature 1072 is disposed within the major surface 105M of the corresponding BTSV 105. The contact area of the bonding feature 1072 and the underlying BTSV 105 may be equal to the surface area of the bottom surface 1072BS of the bonding feature 1072. For example, a lateral dimension (e.g., width or diameter) 1072BW of the bottom surface 1072BS of the respective bonding feature 1072 is less than the lateral dimension 105MW of the major surface 105M of the corresponding BTSV 105. In some embodiments, the periphery of the major surface 105M of the respective BTSV 105 that is not connected to the bonding feature 1072 may be physically covered by the dielectric sublayer 1071A. Alternatively, the lateral dimension 1072BW of the bonding feature 1072 may be substantially equal to or greater than the lateral dimension 105MW of the corresponding BTSV 105.

Still referring to FIG. 1D, the back-side bonding structure 107 includes a plurality of dummy features 1073 disposed on the dielectric layer 106 and laterally covered by the bonding dielectric layer 1071. The dummy features 1073 may not have electrical functions and may be electrically floating. For example, the respective dummy feature 1073 includes a top portion laterally covered by the bonding film 1071B, a bottom portion laterally covered by the dielectric sublayer 1071A, and a bottom surface physically connected to the second dielectric sublayer 1062. The dummy features 1073 may be made of conductive material(s), such as copper, aluminum, metal alloys, a combination thereof, etc. In some embodiments, the dummy features 1073 and the bonding features 1072 are made of the same material and may be formed during the same step. The configuration of the dummy features 1073 may alleviate the adverse impacts associated with the loading effect, thereby improving the uniformity of critical dimensions of the bonding features 1072. For example, the dummy features 1073 raise the metal density and pattern regularity throughout the back-side bonding structure 107.

The major surfaces 1073M of the dummy features 1073 may be accessibly revealed by the bonding dielectric layer 1071 and substantially leveled with the major surface 1071M of the bonding dielectric layer 1071 and the major surfaces 1072M of the bonding features 1072. In some embodiments, the dummy features 1073 facilitate a bonding process with another semiconductor wafer (e.g., T5″). The major surfaces (e.g., 1071M, 1072M, and 1073M) may be collectively viewed as the back-side bonding surface BB4 of the semiconductor wafer T4″. Alternatively, the dummy features 1073 are omitted. Many variations and/or modifications of the back-side bonding structure 107 may be made to embodiments of the disclosure.

Referring to FIG. 1E, a semiconductor wafer T5" is provided for bonding to the semiconductor wafer T4". For example, the semiconductor wafer T5" includes a semiconductor substrate 201 with semiconductor devices 202 formed at the front-side 201F, an interconnect structure 204 formed over the front-side 201F of the semiconductor substrate 201 and electrically coupled to the semiconductor devices 202, and a front-side bonding structure 207 formed on the interconnect structure 204. The semiconductor wafer T5" may (or may not) include isolation regions (not labeled) formed at the front-side 201F of the semiconductor substrate 201. Some components of the semiconductor wafer T5" (e.g., the semiconductor substrate 201, the semiconductor devices 202, and the interconnect structure 204) may be similar to the components of the semiconductor wafer T4" (e.g., the semiconductor substrate 101, the semiconductor devices 102, and the interconnect structure 104), and thus those components will not be redundantly described for the sake of brevity.

In some embodiments, the front-side bonding structure 207 is formed on the major surfaces TMS of the metal patterns TM and the major surface 2042M of the dielectric layer 2042. The front-side bonding structure 207 may include a bonding dielectric layer 2071 and a plurality of bonding features 2072 laterally covered by the bonding dielectric layer 2071. The bonding dielectric layer 2071 may include a first dielectric sublayer 2071A formed on the dielectric layer 2042 of the interconnect structure 204. A second dielectric sublayer 2071B, a third dielectric sublayer 2071C, and a bonding film 2071D may be sequentially formed on the first dielectric sublayer 2071A. In some embodiments, the second dielectric sublayer 2071B includes a dielectric material such as nitride or oxy-nitride with properties different from the first dielectric sublayer 2071A and the third dielectric sublayer 2071C. Under this scenario, the second dielectric sublayer 2071B may act as an etch stop layer. In some embodiments, the bonding film 2071D has a material similar to that of the bonding film 1071B of the semiconductor wafer T4". It is noted that four sublayers of the bonding dielectric layer 2071 is shown for illustrative purposes only, and the bonding dielectric layer 2071 may be a single layer or may have any number of sublayer.

With continued reference to FIG. 1E, the respective bonding feature 2072 of the front-side bonding structure 207 may include a bonding via 2072V and a bonding contact 2072C connected to the bonding via 2072V. In some embodiments, the major surfaces 2072M of the bonding features 2072 are accessibly exposed by the bonding dielectric layer 2071 and may be substantially leveled with the major surface 2071M of the bonding dielectric layer 2071. The bonding via 2072V may be in electrical and physical contact with the metal pattern TM at the outermost level of the interconnect layers 2041. In some embodiments, compared to the bonding features 2072 of the semiconductor wafer T5", the respective bonding feature 1072 of the semiconductor wafer T4" only has the bonding contact that is in direct contact with the corresponding BTSV 105, and the bonding via is omitted.

With continued reference to FIG. 1E and also referring to FIG. 2A, the formation of the bonding features 2072 may involve a dual damascene process (e.g., a via-first dual damascene process or a trench-first dual damascene process). For example, a plurality of dielectric materials is sequentially formed on the interconnect structure 204, and then portions of the dielectric materials are removed using two patterned mask layers (not shown; e.g., photoresists), where one of the patterned mask layers having openings that define via holes and another one of the patterned mask layers having openings that define trenches in communication with the respective via hole. For example, via openings VO2 are formed in the first dielectric sublayer 2071A and trenches VO3 are formed in the stack of the second dielectric sublayer 2071B, the third dielectric sublayer 2071C, and a bonding film 2071D. Next, a barrier material BM (e.g., similar to the barrier material VB described in FIG. 1A) is formed on the inner sidewalls of the dielectric materials that define the respective via opening and trench, and also formed on the portions of the metal patterns TM that are accessibly revealed by the via openings and trenches. Next, the conductive material CM (e.g., similar to the conductive material CC described in FIG. 1A) may be deposited on the barrier material BM to fill the via openings and the trenches. A seed material (not shown) is optionally deposited on the barrier material BM to assist the formation of the conductive material CM. Subsequently, the conductive material CM and the underlying barrier material BM that are outside the trenches may be removed, such as by CMP, etching, or any suitable technique. It should be noted that the barrier material and the seed material are eliminated from the other drawings for ease of illustration.

In some embodiments, the bonding via 2072V and the overlying bonding contact 2072C are formed of the same materials by the same step. Accordingly, no visible interface may be formed between the top surface of the bonding via 2072V and the bottom surface of the bonding contact 2072C. In some embodiments, the bonding vias 2072V have tapered sidewalls. For example, the bonding vias 2072V are tapered in a thickness direction from the front-side 201F to the back-side 201B. In some embodiments, the bonding contact 2072C of the respective bonding feature 2072 has the dimension greater than the corresponding bonding via 2072V. The bonding contact 2072C may have tapered sidewalls that are tilted along the same direction as the bonding via 2072V. Alternatively, the bonding via 2072V and/or the bonding contact 2072C may have substantially vertical sidewalls.

Still referring to FIG. 1E, the front-side bonding structure 207 may include a plurality of dummy features 2073 which do not have electrical functions and may be electrically floating in the semiconductor wafer T5". In some embodiments, the dummy features 2073 are formed during the same step of forming the bonding contacts 2072C of the bonding features 2072 and may have cross-sectional profiles similar to those of the bonding contacts 2072C. The major surfaces 2073M of the dummy features 2073 may be substantially leveled with the major surface 2071M of the bonding dielectric layer 2071 and the major surfaces 2072M of the bonding features 2072. The major surfaces (e.g., 2071M, 2072M, and 2073M) may be collectively viewed as a front-side bonding surface FB5 of the semiconductor wafer T5".

Referring to FIG. 1F and also referring to the enlarged view shown in FIG. 2B, the semiconductor wafer T4" and the semiconductor wafer T5" may be vertically coupled together using a bonding process to form a bonded wafer T45". As shown in the enlarged view of FIG. 2B, the difference between the bonding feature 2072 and the bonding feature 1072 includes that the bonding feature 2072 has the bonding via 2072V, while the bonding feature 1072 does not have the bonding via. By omitting the bonding via from the bonding feature 1072, the number of the patterned mask layer for forming the bonding features may be reduced and the manufacturing process may be simplified.

In some embodiments, to facilitate the bonding process, a surface preparation step (e.g., a removal process, an activation process, a cleaning process, and/or the like) is adapted to prepare the front-side bonding surface FB5 of the semiconductor wafer T5" and the back-side bonding surface BB4 of the semiconductor wafer T4". It is understood that the bonding surfaces are as clean as possible so that a high quality bond is formed between two wafers. In some embodiments, the surface preparation step is used to remove a portion of or all of the oxide material(s) on the metal features (e.g., 1072, 1073, 2072, and 2073). After the surface preparation step, the front-side bonding surface FB5 of the front-side bonding structure 207 of the semiconductor wafer T5" may be bonded to the back-side bonding surface BB4 of the back-side bonding structure 107 of the semiconductor wafer T4".

The bonding may be achieved by aligning the bonding features 2072 of the semiconductor wafer T5" with the bonding features 1072 of the semiconductor wafer T4". The dummy features 2073 and the bonding dielectric layer 2071 of the semiconductor wafer T5" may be respectively aligned with the dummy features 1073 and the bonding dielectric layer 1071 of the semiconductor wafer T4". It should be understood that the alignment of wafers may be offset due to process variation. After the alignment, the semiconductor wafer T5" may be placed on and in direct contact with the semiconductor wafer T4". When the major surface 2071M of the bonding dielectric layers 2071 is in physical contact with the major surface 1071M of the bonding dielectric layer 1071, the bonding dielectric layers (1071 and 2071) are pre-bonded. After the pre-bonding, the bonding features 2072 and the dummy features 2073 may be in physical contact with the corresponding bonding features 1072 and the corresponding dummy features 1073, respectively.

In some embodiments, after pre-bonding the semiconductor wafers (T4" and T5"), a treatment for dielectric bonding and metal bonding is performed to form bonds at the bonding interface BI45. The bonds may include dielectric-dielectric bonds (e.g., oxide-oxide bonds) and metal-to-metal bonds (e.g., copper-copper bonds). In some embodiments, metal-dielectric bonds (e.g., copper-oxide bonds) are also formed at the bonding interface BI45. After the bonding of the semiconductor wafers (T4" and T5") is performed, the bonding features (1072 and 2072) may provide vertical and electrical connections in the bonded wafer T45". The dummy features (1073 and 2073) are bonded together and may be electrically floating in the bonded wafer T45".

Referring to FIG. 1G and FIG. 1H, the temporary carrier 50, the temporary adhesive layer 51, and the sacrificial layer SL may be removed, and an edge portion EP of the bonded wafer T45" may also be removed. For example, the temporary carrier 50, the temporary adhesive layer 51, and the sacrificial layer SL is removed from the semiconductor wafer T4" by any suitable methods (e.g., grinding, etching, peeling, combinations thereof, etc.) to accessibly reveal the dielectric material DM of the semiconductor wafer T4". In some embodiments, the bonded wafer T45" is flipped upside down to perform the removal process, and the semiconductor wafer T5" may provide support during the processes. Since the semiconductor substrate 101 of the semiconductor wafer T4" has been subjected to the thinning process, the semiconductor wafer T5" may have a thickness TH5 that is thicker than the thickness TH4 of the semiconductor wafer T4". In some embodiments, the thickness TH5 of the semiconductor wafer T5" ranges from about 500 μm to about 900 μm, and the thickness TH4 of the semiconductor wafer T4" ranges from about 0.5 μm to about 10 μm.

With continued reference to FIG. 1H, the edge portion EP of the bonded wafer T45" is removed using a trimming process to form a trimmed wafer T45' including a trimmed semiconductor wafer T4' and a trimmed semiconductor wafer T5'. In some embodiments, the trimming process is performed at the same step of removal of the temporary carrier 50, the temporary adhesive layer 51, and the sacrificial layer SL. The trimming process may utilize suitable means (e.g., etching, a laser beam, a dicing blade, etc.) to remove the edge portion EP. One of the reasons for trimming the edge portion EP is to remove the defective zones. For example, defects (e.g., chipping, cracking, delamination, etc.) may occur at the wafer edge after the bonding (and/or the thinning), and those defects may lead to subsequent processing inefficiencies or cause yield problems. The defects may be handled by performing the trimming process to remove the wafer edge.

In some embodiments, after the edge portion EP of the bonded wafer T45" is removed, the trimmed wafer T45' having a ledge 45L along a trimmed and coterminous sidewall 45E. The ledge 45L may include a bottom edge of the semiconductor substrate 201 of the trimmed semiconductor wafer T5'. Depending on the trim depth, the ledge 45L may include material(s) overlying the semiconductor substrate 201. Alternatively, all of the edge portion of the bonded wafer may be removed so that the trimmed wafer may not have ledge. It is understood that a trimmed depth and a trimmed width may be tuned depending on the requirements and construe no limitation in the disclosure.

Referring to FIG. 1I and the enlarged view of FIG. 2C, a front-side bonding structure 307 of the trimmed semiconductor wafer T4' may be formed for further coupling to another structure. For example, the bonding contacts 3072C are formed on the bonding vias 3072V to form bonding features 3072 laterally covered by a bonding dielectric layer 3071. In some embodiments, since the bonding vias 3072V have been already formed, the formation of the bonding contacts 3072C involves a single damascene process. For example, portions the dielectric material DM are removed to form a plurality of trenches VO4 that accessibly reveal the top surfaces 3072VT of the bonding vias 3072V. The respective trench may also accessibly expose the first dielectric sublayer 3071 surrounding the top surface 3072VT of the bonding via 3072V. In some embodiments, the trenches VO4 may be formed by forming a patterned mask layer (not shown; e.g., photoresist) having openings that define the trenches VO4, etching the dielectric material DM, and removing the patterned mask layer.

It is understood that when forming the patterned mask layer having openings that define the trenches VO4, a spin-coating process may be performed to deposit a layer of mask material on the trimmed wafer T45'. The spin-coating process may incur centrifugal forces to the deposited layer of mask material, which may result in the deposited mask material accumulating, in the form of a hump, near the trimmed edge around the perimeter of the trimmed wafer T45'. If a dual damascene process is performed to form the bonding features on the trimmed wafer, two patterned mask layers having different openings that define trenches and via holes are required, and thus the spin-coating process should be performed at least twice for forming two layers of mask material. This may lead to the requirement that the perimeter of the trimmed wafer T45' over which the layers of mask materials have been deposited must be further processed in order to remove the hump. In the present embodiment, the bonding vias 3072V have been formed at the early stage, and thus at this stage, the bonding contacts 3072C of the bonding features 3072 may be formed on the trimmed wafer T45' using the single damascene process. In the single damascene process, the spin-coating process may be performed once to deposit the layer of mask material. Compared to the dual damascene process, the thickness of the hump formed during the single damascene process is reduced or may be negligible, and thus no additional process is required to remove the hump. The manufacturing process may be simplified and manufacturing time may also be shortened.

With continued reference to FIG. 1I and FIG. 2C, in some embodiments in which the dielectric material DM includes multiple sublayers, after forming the trenches VO4 in the dielectric material DM, a second dielectric sublayer 3071B, a third dielectric sublayer 3071C, and a bonding film 3071D of the bonding dielectric layer 3071 is formed. For example, additional dielectric materials (e.g., material of the bonding film 3071D and/or material of the third dielectric sublayer 3071C) are sequentially deposited on the dielectric material DM before forming the patterned mask layer, and then the patterned mask layer is formed on the additional dielectric materials, the etching is subsequently performed to the additional dielectric materials and the underlying dielectric material DM. In some embodiments, the second dielectric sublayer 3071B includes a dielectric material such as nitride or oxy-nitride with properties different from the first dielectric sublayer 3071A and the third dielectric sublayer 3071C. Under this scenario, the second dielectric sublayer 3071B may act as an etch stop layer. In some embodiments, the bonding film 3071D has a material similar to the material of the bonding film 1071B of the back-side bonding structure 107.

Still referring to the enlarged view of FIG. 2C, after forming the trenches VO4, a barrier material CB may be deposited to line the trenches VO4. For example, the barrier material CB is formed on the inner sidewalls of the dielectric stack that define the respective trench VO4 and also formed on the top surface 3072VT of the corresponding bonding via 3072V that is accessibly revealed by the trench VO4. Next, the conductive material CC may be deposited to fill each trench VO4. The barrier material CB and the conductive material CC may be the same or similar to the barrier material VB and the conductive material VC of the bonding via 3072V. In some embodiments, a seed material (not shown) is deposited on the barrier material CB to assist the formation of the conductive material CC. Subsequently, the conductive material CC and the barrier material CB that are outside the trenches VO4 may be removed to form the bonding contacts 3072C. It should be noted that the barrier material and the seed material are eliminated from the other drawings for ease of illustration. As shown in FIG. 2C, since the bonding via 3072V and the overlying bonding contact 3072B are formed at two separating steps, the barrier material interface BMI is between the top of the bonding via 3072V and the bottom of the bonding contact 3072B.

With continued reference to FIG. 1I, the front-side bonding structure 307 may include a plurality of dummy features 3073 covered by the bonding dielectric layer 3071. For example, the dummy features 3073 do not have electrical functions and may be electrically floating. In some embodiments, the dummy features 3073 are formed during the same step of forming the bonding contacts 3072C of the bonding features 3072 and may have cross-sectional profiles similar to those of the bonding contacts 3072C. The major surfaces 3073M of the dummy features 3073 may be substantially leveled with the major surface 3071M of the bonding dielectric layer 3071 and the major surfaces 3072M of the bonding features 3072. The major surfaces (e.g., 3071M, 3072M, and 3073M) may be collectively viewed as a back-side bonding surface BB4 of the trimmed semiconductor wafer T4'.

Referring to FIG. 1J and with continued reference to FIG. 1I, a semiconductor structure 10 including a die stack 10D is provided. For example, the die stack 10D includes a first stack T123 and a second stack T45 stack upon and electrically coupled to each other. In some embodiments, the first stack T123 includes at least two tiers and a bonding interface BI is formed between the adjacent tiers. It should be noted that the number of tiers and the number of the bonding interface BI in the first stack T123 construe no limitation. The bonding interface(s) BI in the first stack T123 may be similar to the bonding interface BI45 of the second stack T45 or may be similar to other bonding interface(s) described elsewhere in the disclosure. It should be noted that the details regarding the first stack T123 are not shown in FIG. 1J, but may be found in the discussion of the embodiments related to FIG. 6D. For example, the back-side bonding structure 107 of the tier T3 of the first stack T123 shown in FIG. 6D is bonded to the front-side bonding structure 307 to form the bonding interface BI34. Alternatively, the first stack T123 is replaced with other die stack (e.g., T123' shown in FIG. 8B) described elsewhere in the disclosure.

In some embodiments, the first stack T123 and the second stack T45 are separately fabricated and then bonded together. For example, the second stack T45 is formed by dicing the trimmed wafer T45' shown in FIG. 1I. In some embodiments, after forming the front-side bonding structure 307, the resulting structure shown in FIG. 1I is coupled to another structure (e.g., the composite structure shown in FIG. 6C, another semiconductor wafer with a bonding structure, etc.). For example, the front-side bonding structure 307 of the trimmed semiconductor wafer T4' is bonded to another bonding structure (e.g., a back-side bonding structure or a front-side bonding structure described elsewhere in the disclosure) to form the bonding interface BI34. Next, a redistribution structure 10R and conductive terminals 10T may be sequentially formed over the bonded wafer stack for further electrical connection.

With continued reference to FIGS. 1I-1J, the redistribution structure 10R may include a passivation layer 10RP and a plurality of conductive vias 10RV and conductive patterns 10RL formed in the passivation layer 10RD. For example, the passivation layer 10RD is formed on the topmost tier, where the trimmed semiconductor wafer T5' serves as the bottommost tier. The topmost tier may include at least one vertical connection (e.g., BTSV 205 shown in FIG. 8B) for coupling the die stack to the redistribution structure 10R (e.g., conductive vias 10RV and conductive patterns 10RL). In some embodiments, at least a portion of the conductive patterns 10RL at the topmost level may be accessibly revealed by the passivation layer 10RD, and the conductive terminals 10T may be formed on those portion of the conductive patterns 10RL to be electrically coupled to the underlying die stack through the redistribution structure 10R. The conductive terminals 10T may be or may include micro-bumps, metal pillars, controlled collapse chip connection (C4) bumps, electroless nickel-electroless palladium-immersion gold (ENEPIG) formed bumps, and/or the like.

Afterwards, a singulation process may be performed to cut through the redistribution structure and the underlying stack so as to form a plurality of semiconductor structures 10. As shown in FIG. 1J, the second stack T45 of the semiconductor structure 10 includes the tier T4 and the tier T5 bonded to the tier T4 with the bonding interface BI45 formed therebetween. Since the front-side bonding structure 207 of the tier T5 and the back-side bonding structure 107 of the tier T4 are bonded together, the bonding interface BI45 therebetween may be viewed as a front-to-back bonding interface. Many variations and/or modifications can be made to embodiments as will be described later in the disclosure.

Figure 3:
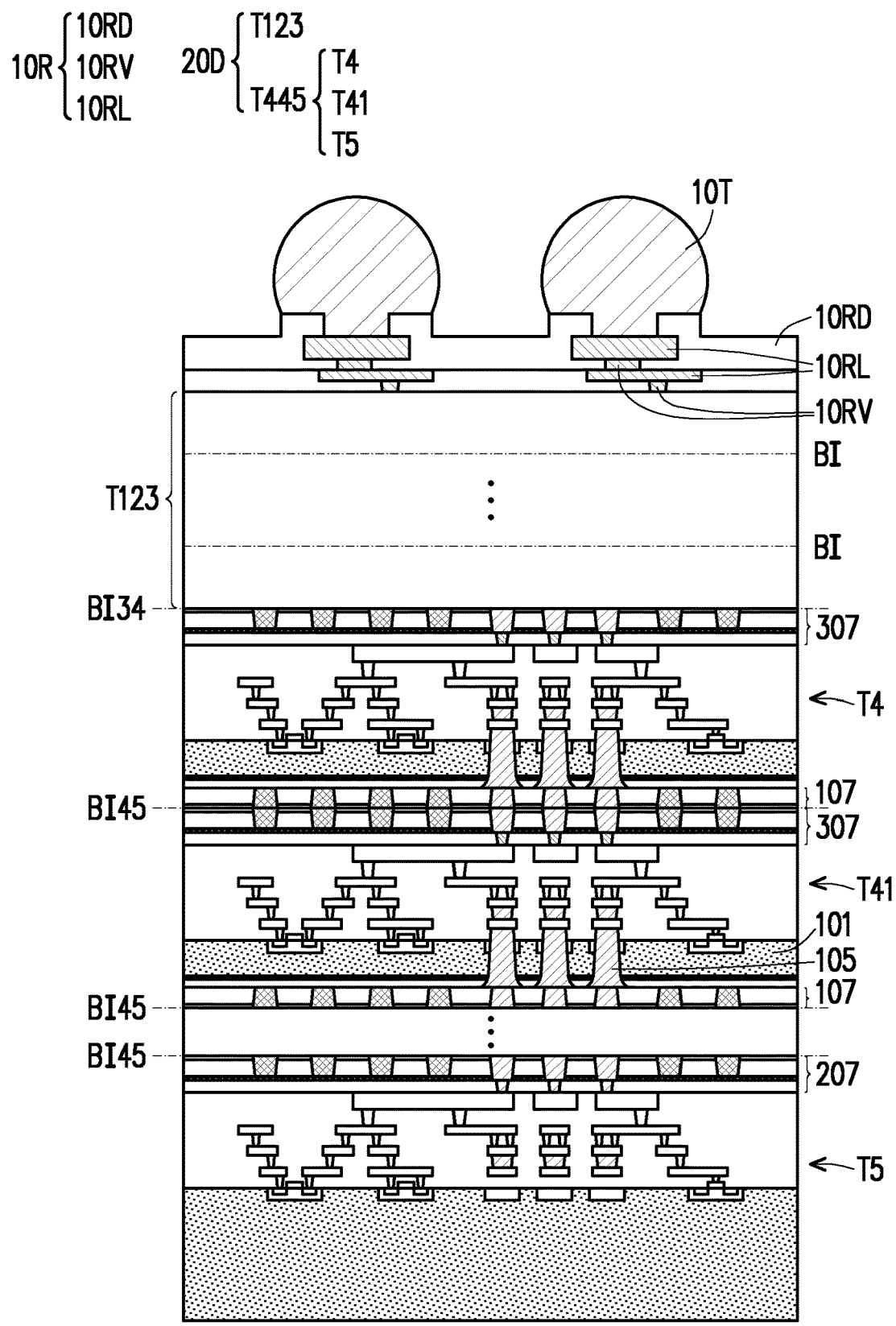
FIG. 3 is a schematic cross-sectional view showing a semiconductor structure including a front-to-back bonding interface according to some embodiments.

FIG. 3 is a schematic cross-sectional view showing a semiconductor structure including a front-to-back bonding interface according to some embodiments. The semiconductor structure 20 shown in FIG. 3 may be similar to the semiconductor structure 10 shown in FIG. 1J, and the semiconductor structure 20 may be formed in a similar manner as forming the semiconductor structure 10. It is noted that the identical/similar components are marked with identical/similar numerals, and for simplicity reason, the identical/similar components are not repeated herein.

Referring to FIG. 3 and with reference to FIG. 1J, the semiconductor structure 20 includes a die stack 20D, the redistribution structure 10R disposed on the die stack 20D, and the conductive terminals 10T disposed on the redistribution structure 10R and electrically coupled to the die stack 20D through the redistribution structure 10R. The die stack 20D includes the first stack T123 and a second stack T445. It is understood that the first stack T123 may be replaced with die stack described elsewhere in the disclosure. The second stack T445 may be similar to the second stack T45 shown in FIG. 1J, except that the second stack T445 includes at least one additional tier T41 interposed between the tier T4 and the tier T5. It should be noted that the number of the tier T41 depends on process and product requirements and construes no limitation in the disclosure.

In some embodiments, the formation of the second stack T445 includes at least the following steps. After bonding the semiconductor wafer to the semiconductor wafer T4" (e.g., similar to the process described in FIG. 1F), the semiconductor substrate of the semiconductor wafer may be thinned, and then the BTSVs 105 may be formed in the thinned semiconductor substrate 101 (e.g., similar to the processes described in FIGS. 1B-IC). Next, the back-side bonding structure 107 may be formed on the thinned semiconductor substrate and the BTSVs 105 (e.g., similar to the processes described in FIG. 1D). In some embodiments, after forming the back-side bonding structure 107, additional semiconductor wafer(s) may be bonded to the back-side bonding structure 107. The aforementioned steps may be performed several times, if desired. Subsequently, the temporary carrier is removed and the bonded wafer is trimmed (as shown in FIGS. 1G-1H), and then the front-side bonding structure 307 (e.g., similar to the process described in FIG. 1I) may be formed to render the resulting structure. The following processes (e.g., bonding to another wafer stack, forming the redistribution structure 10R and the conductive terminals 10T, and singulation) may be similar to the processes described in FIG. 1J.

Figure 4A:
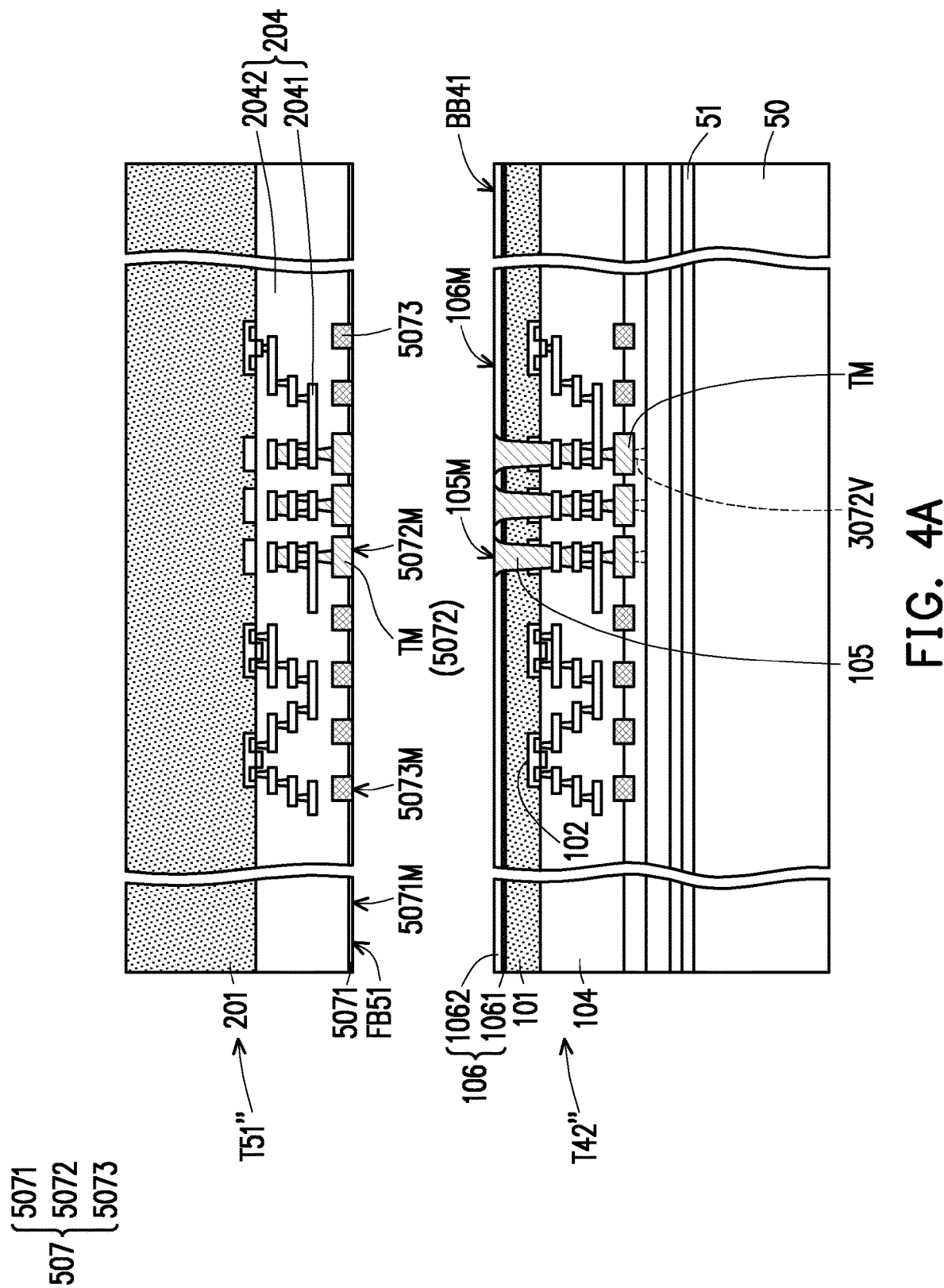
FIGS. 4A-4D are schematic cross-sectional views showing various stages in a manufacturing method of a semiconductor structure including a front-to-back bonding interface according to some embodiments.
Figure 4B:
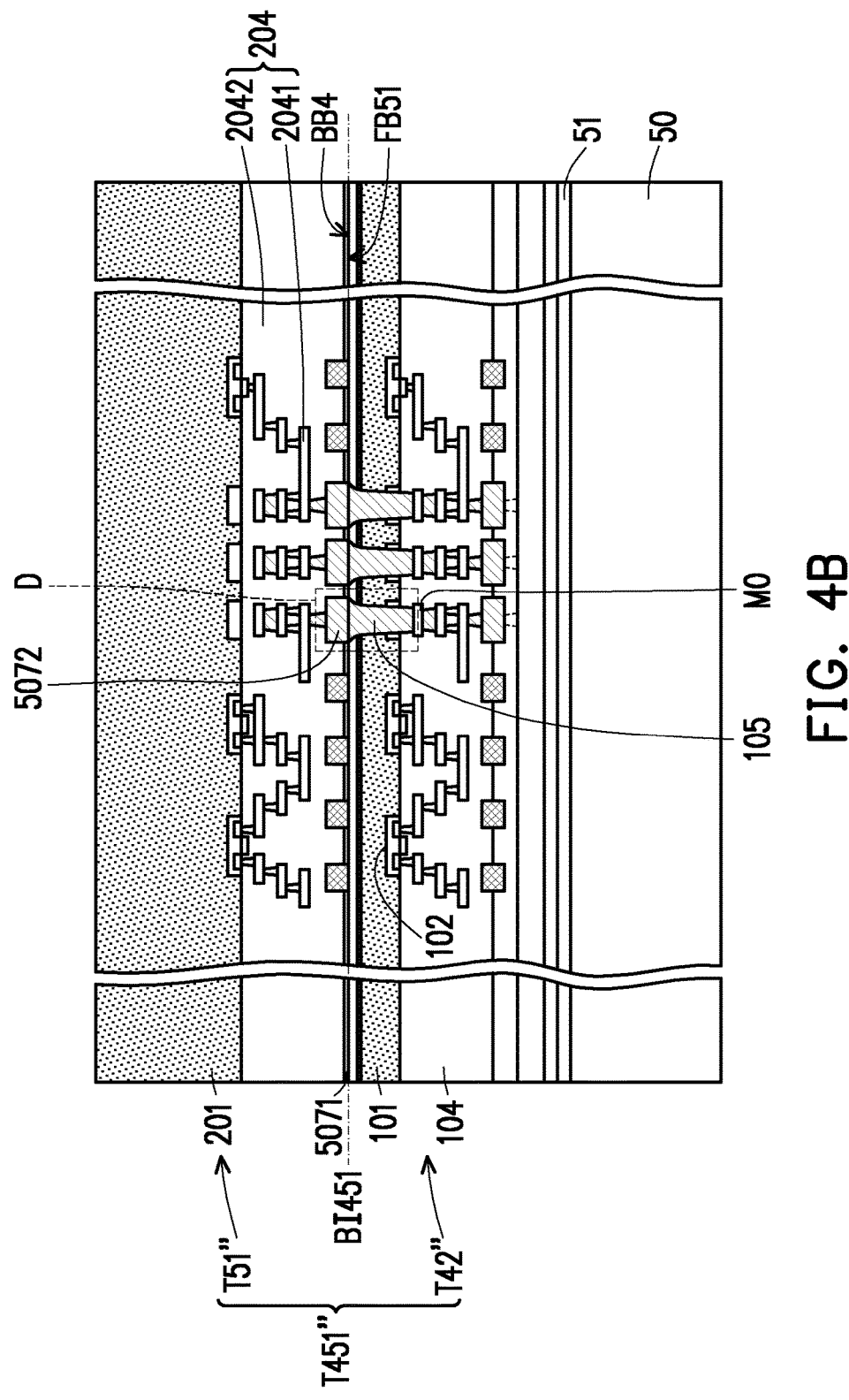
Figure 4C:
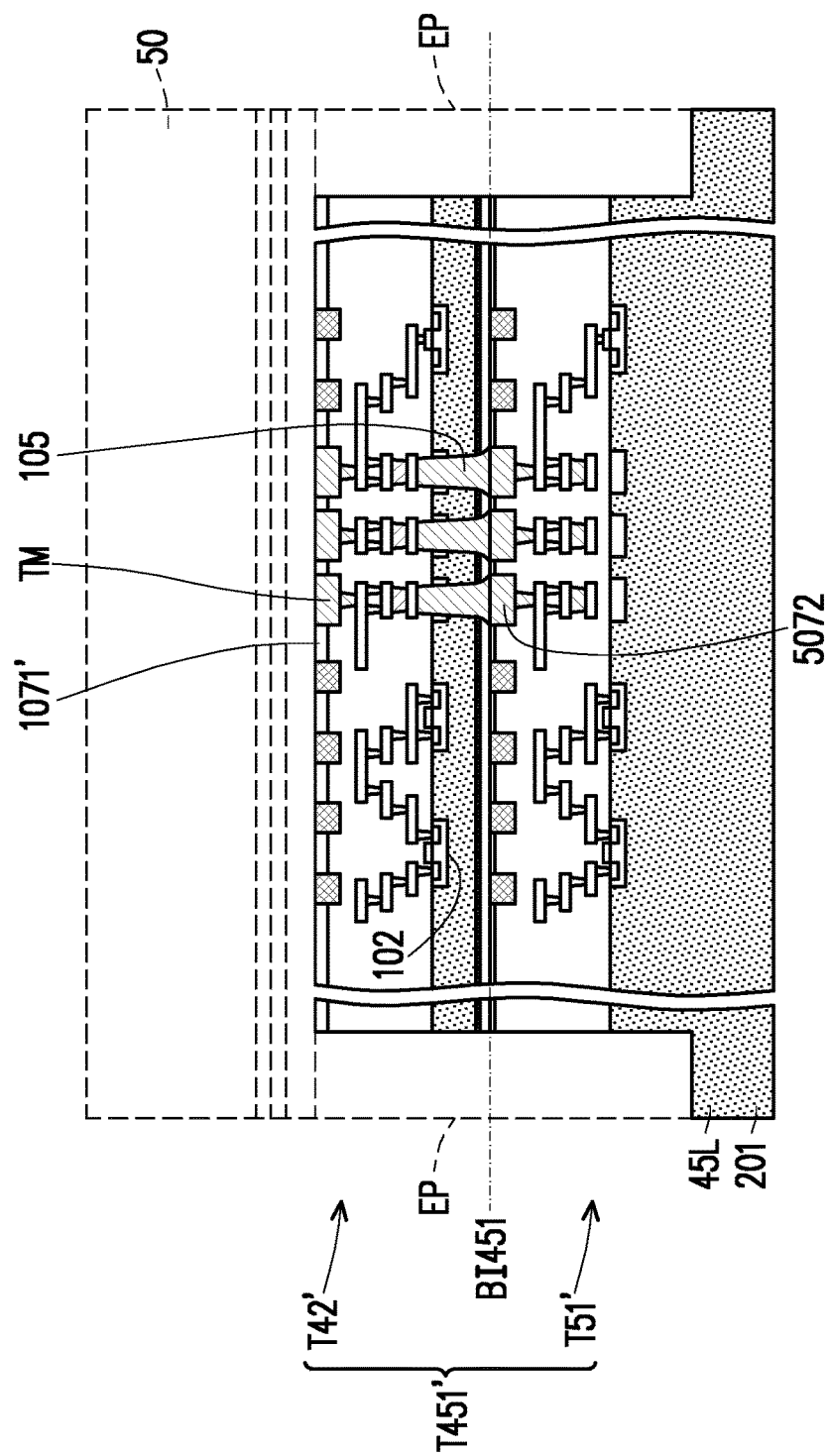
Figure 4D:
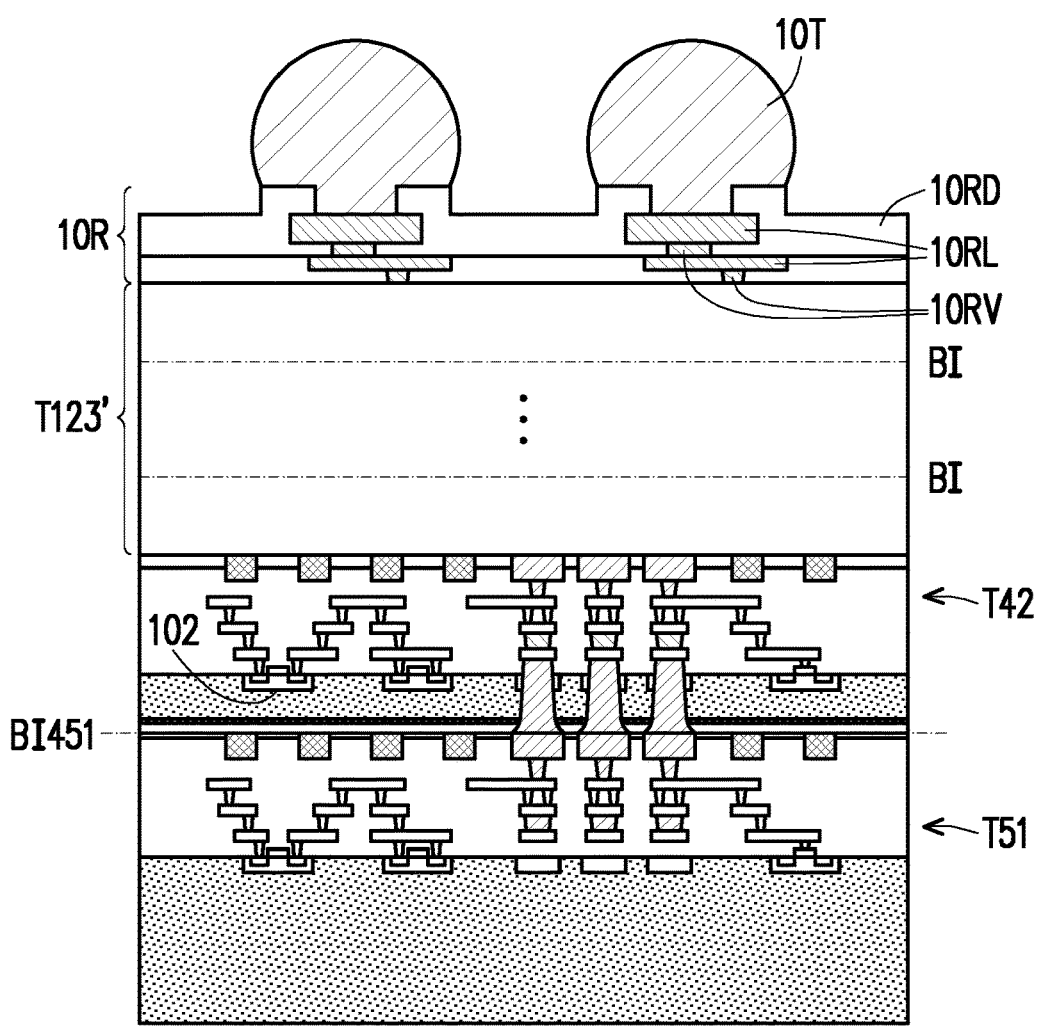
Figure 5A:
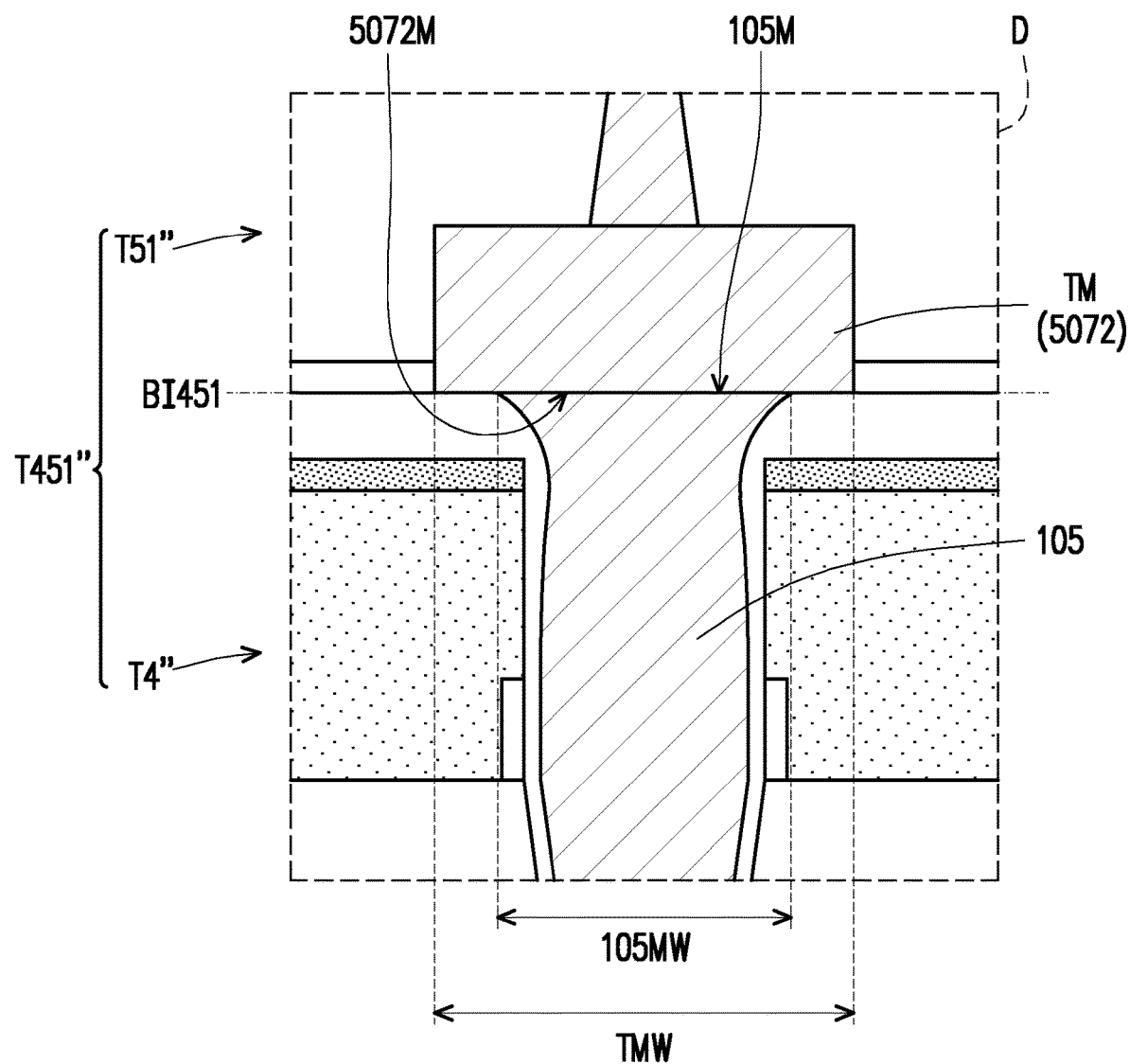
FIG. 5A is a schematic and enlarged cross-sectional view showing a dashed box D outlined in FIG. 4B according to some embodiments.
Figure 5B:
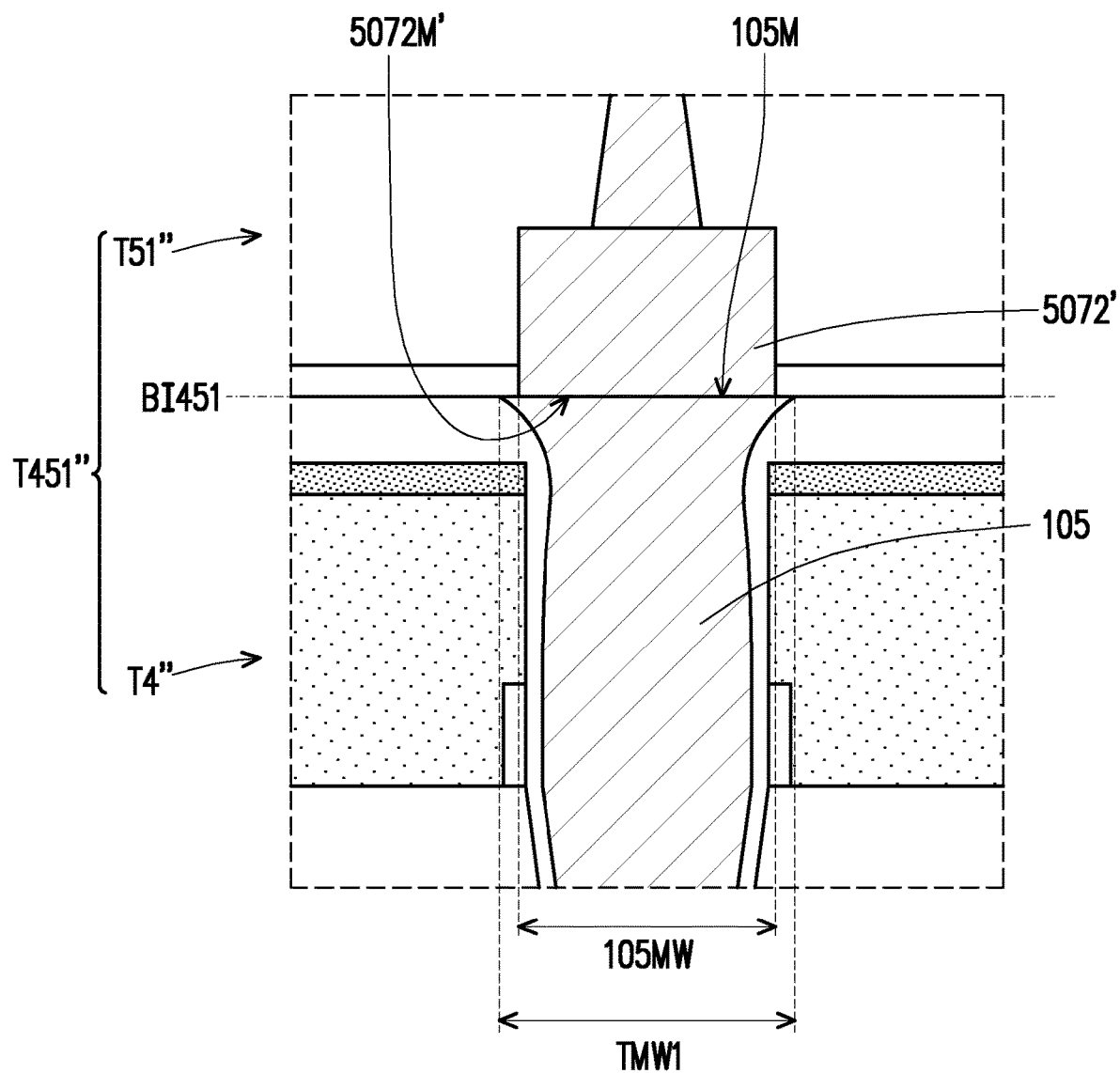
FIGS. 5B-5C are schematic and enlarged cross-sectional views showing variations in the dashed box D outlined in FIG. 4B according to some embodiments.
Figure 5C:
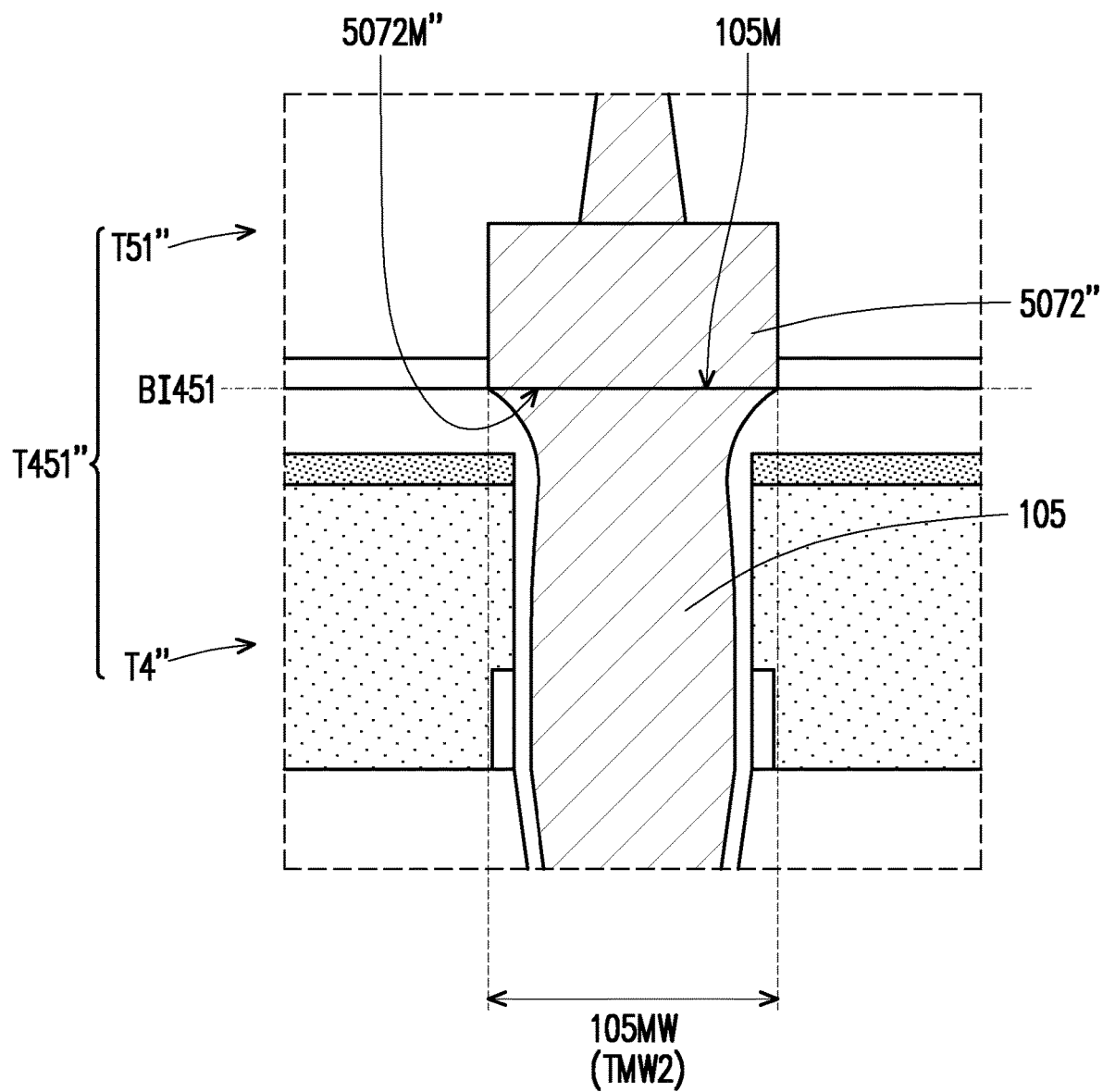

FIGS. 4A-4D are schematic cross-sectional views showing various stages in a manufacturing method of a semiconductor structure including a front-to-back bonding interface according to some embodiments, FIG. 5A is a schematic and enlarged cross-sectional view showing a dashed box D outlined in FIG. 4B according to some embodiments, and FIGS. 5B-5C are schematic and enlarged cross-sectional views showing variations in the dashed box D outlined in FIG. 4B according to some embodiments. Unless specified otherwise, the components in the embodiments are essentially the same as the like components, which are denoted by like reference numerals in the embodiments described in the preceding paragraphs.

Referring to FIG. 4A, a semiconductor wafer T51" and a semiconductor wafer T42" are separately prepared for bonding. The semiconductor wafer T42" may be disposed on the temporary carrier 50, and the formation of the semiconductor wafer T42" may be similar to the processes described in FIGS. 1A-1C. In some embodiments, the semiconductor wafer T42" does not have the bonding vias 3072V formed on the metal patterns TM. Although, the bonding vias 3072V may be formed at this stage for forming the front-side bonding structure in the subsequent process, in accordance with some embodiments. In some embodiments in which the bonding vias 3072V are omitted, the metal patterns TM of the semiconductor wafer T42" may act as the bonding features. A plurality of dummy features may (or may not) be formed aside the metal patterns TM. The bonding vias 3072V and the dummy features of the semiconductor wafer T42" are illustrated in phantom to indicate they may be or may not be present. In some embodiments, the metal patterns TM (and the dummy features, if exist) are buried the dielectric layer at this stage for protection, where the dielectric layer covering the metal patterns TM may serve as the bonding dielectric layer in the subsequent bonding process.

In some embodiments, compared to the structure shown in FIG. 1D, the semiconductor wafer T42" does not have the back-side bonding structure (e.g., 107 shown in FIG. 1D) formed over the semiconductor substrate 101. Under this scenario, the BTSVs 105 may act as the bonding features of the semiconductor wafer T42". In some embodiments, the dielectric layer 106 overlying the semiconductor substrate 101 may act as the bonding dielectric layer for back-side bonding. For example, the second dielectric sublayer 1062 overlying the first dielectric sublayer 1061 is the bonding film (e.g., 1071B described in FIG. 1D). A plurality of dummy features (not shown) is optionally formed in the dielectric layer 106 for the subsequent bonding process. The major surfaces 105M of the BTSVs 105 and the major surface 106M of the dielectric layer 106 that are substantially level may serve as a back-side bonding surface BB41 of the semiconductor wafer T42".

The semiconductor wafer T51" may be similar to the semiconductor wafer T5" in FIG. 1E. In some embodiments, the semiconductor wafer T51" includes the metal patterns TM (e.g., conductive pads) at the outermost level of the interconnect layers 2041, where the metal patterns TM may act as bonding features 5072 of a front-side bonding structure 507. The dummy metal patterns formed aside the metal patterns TM may act as dummy features 5073 of the front-side bonding structure 507. Alternatively, the dummy features 5073 are omitted. In some embodiments, a bonding dielectric layer 5071 of the front-side bonding structure 507 is formed on the dielectric layer 2042 of the interconnect structure 204 to laterally cover the bonding features 5072 and the dummy features 5073. The bonding dielectric layer 5071 may be or may include the bonding film as described in FIG. 1E. In some embodiments, the bonding dielectric layer 5071 includes more than one sublayer to cover the entire sidewalls of the dummy features 5073 and the bonding features 5072. In some embodiments, the major surfaces 5072M of the bonding features 5072 are accessibly exposed by the bonding dielectric layer 5071 and may be substantially leveled with the major surface 5071M of the bonding dielectric layer 5071. The major surfaces 5073M of the dummy features 5073 may be substantially leveled with the major surface 5071M of the bonding dielectric layer 5071 and the major surfaces 5072M of the bonding features 5072. The major surfaces (e.g., 5071M, 5072M, and 5073M) may be collectively viewed as a front-side bonding surface FB51 of the semiconductor wafer T51".

Referring to FIG. 4B, the semiconductor wafer T51" may be bonded to the semiconductor wafer T42" to form a bonded wafer T451". For example, the front-side bonding surface FB51 of the semiconductor wafer T51 is bonded to the back-side bonding surface BB4 of the semiconductor wafer T42". The bonds at the bonding interface BI451 may include dielectric-dielectric bonds (e.g., oxide-oxide bonds) and metal-to-metal bonds (e.g., copper-copper bonds). In some embodiments, metal-dielectric bonds (e.g., copper-oxide bonds) are also formed at the bonding interface BI451. The bonding process may be similar to the process described in FIG. 1F, and thus the details of the process are not repeatedly described for the sake of brevity. After the bonding, the respective BTSV 105 includes one end landing on the metal pattern MO and the opposing end bonded to the metal pattern TM (i.e. bonding feature 5072).

With continued reference to FIG. 4B and also referring to the enlarged view in FIGS. 5A-5C, the metal pattern TM of the semiconductor wafer T51" is in direct contact with the respective BTSV 105 of the semiconductor wafer T42", where the metal pattern TM and the BTSV 105 act as the bonding features to provide vertical and electrical connection in the bonded wafer T451". As shown in FIG. 5A, the lateral dimension (e.g., width or diameter) TMW of the major surface 5072M of the bonding feature 5072 is greater than the lateral dimension 105MW of the major surface 105M of the BTSV 105. Under this scenario, the contact area of the bonding features (5072 and 105) at the bonding interface BI451 is equal to the surface area of the major surface 105M of the BTSV 105. Many variations and/or modifications can be made.

As shown in FIG. 5B, the lateral dimension TMW1 of the major surface 5072M' of the bonding features 5072' is less than the lateral dimension 105MW of the major surface 105M of the BTSV 105. Under this scenario, the contact area of the bonding features at the bonding interface BI451 is equal to the surface area of the major surface 5072M' of the bonding feature 5072'. Alternatively, as shown in FIG. 5C, the lateral dimension TMW2 of the major surfaces 5072M" of the bonding features 5072" is substantially equal to the lateral dimension 105MW of the major surface 105M of the BTSV 105. Under this scenario, the contact area of the bonding features at the bonding interface BI451 is equal to the surface area of the major surface 5072M" of the bonding feature 5072" and the surface area of the major surface 105M of the BTSV 105.

Referring to FIG. 4C and with continued reference to FIG. 4B, the temporary carrier 50 and the redundant dielectric material(s) may be removed, and the edge portion EP of the bonded wafer may be trimmed to form the trimmed wafer T451'. The trimmed wafer T451' may include the trimmed semiconductor wafer T42' and the trimmed semiconductor wafer T51'. The metal patterns TM of the trimmed semiconductor wafer T42' may be accessibly revealed by the bonding dielectric layer 1071'. For example, during the removal of the temporary carrier 50 and the redundant dielectric material(s), the dielectric material that covers the metal patterns TM (and the dummy metal patterns, if exist) may also be removed/planarized until the metal patterns TM are revealed for bonding. In some embodiments in which the bonding vias 3072V are formed on the metal patterns TM at the early stage, the front-side bonding structure (e.g., 307) may be formed on the trimmed semiconductor wafer T42' for further connection. In some embodiments, the trimming process is performed at the same step to form the ledge 45L of the semiconductor substrate 201. The removal of the temporary carrier 50 and the redundant dielectric material(s) may be similar to the process described in FIG. 1G, and the trimming process may be similar to the processes described in FIG. 1H.

Referring to FIG. 4D, a semiconductor structure 30 including a die stack 30D is provided. For example, the die stack 30D includes the first stack T123' bonded to the second stack T451. The first stack T123' may be similar to the first stack T123' shown in FIG. 8B or may be replaced with other die stack described elsewhere in the disclosure. The second stack T451 may include the tiers (T42 and T51) formed by singulating the trimmed wafer T451'. The forming process of the semiconductor structure 30 may be similar to that of the semiconductor structure 10 described in FIG. 1J. For example, the trimmed wafer T451' is bonded to another wafer stack, and the redistribution structure 10R and the conductive terminals 10T are subsequently formed. Afterwards, the singulation process is performed to form a plurality of semiconductor structures 30. Many variations and/or modifications can be made to embodiments of the disclosure. For example, the second stack T451 includes more than two tiers, where additional tier(s) (e.g., tier T42, tier T4 in FIG. 1J, or other tier described elsewhere) may be stacked upon and bonded to the tier T42. Other configuration may be possible depending on product requirements.

Figure 6A:
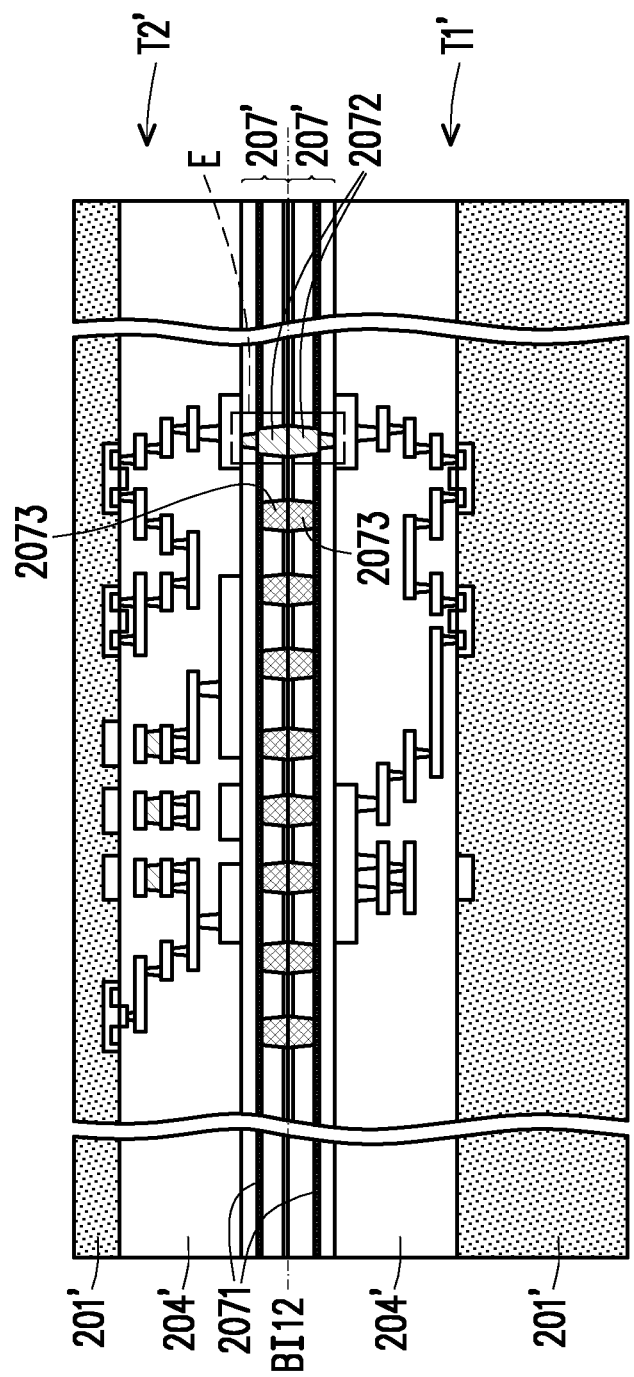
FIGS. 6A-6D are schematic cross-sectional views showing various stages in a manufacturing method of a semiconductor structure including a front-to-front bonding interface according to some embodiments.
Figure 6B:
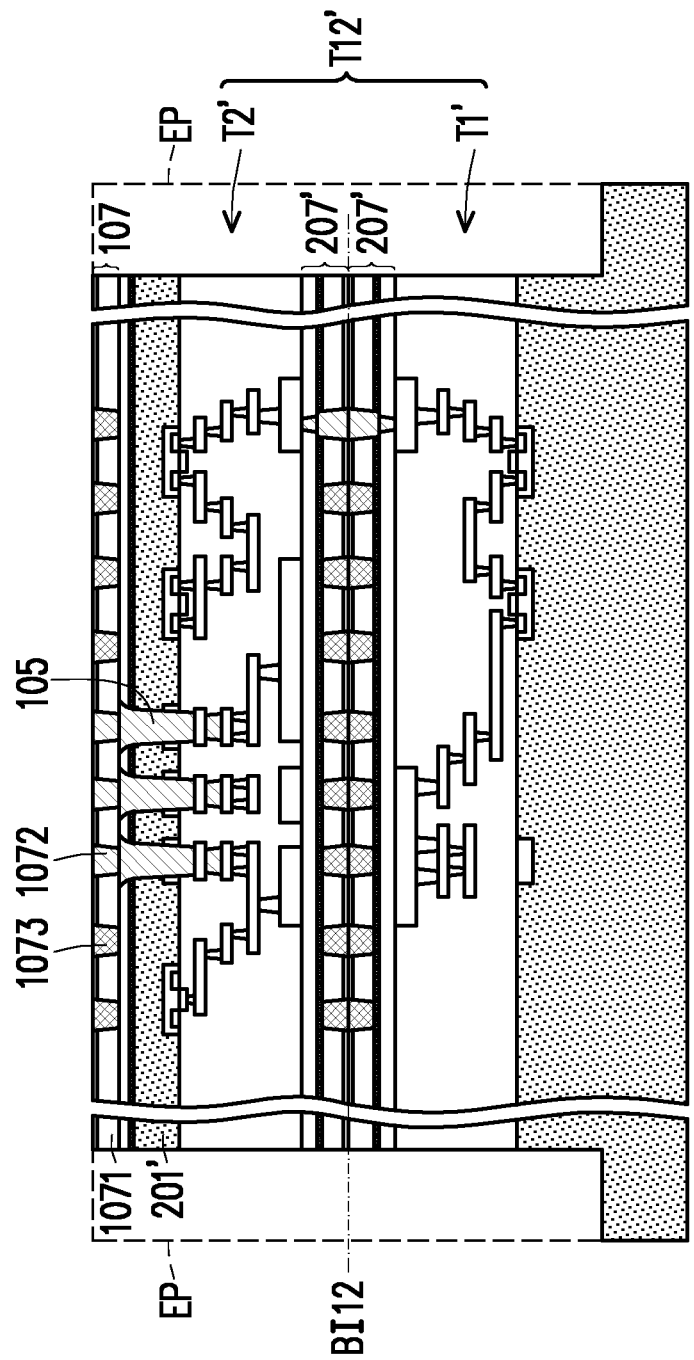
Figure 6C:
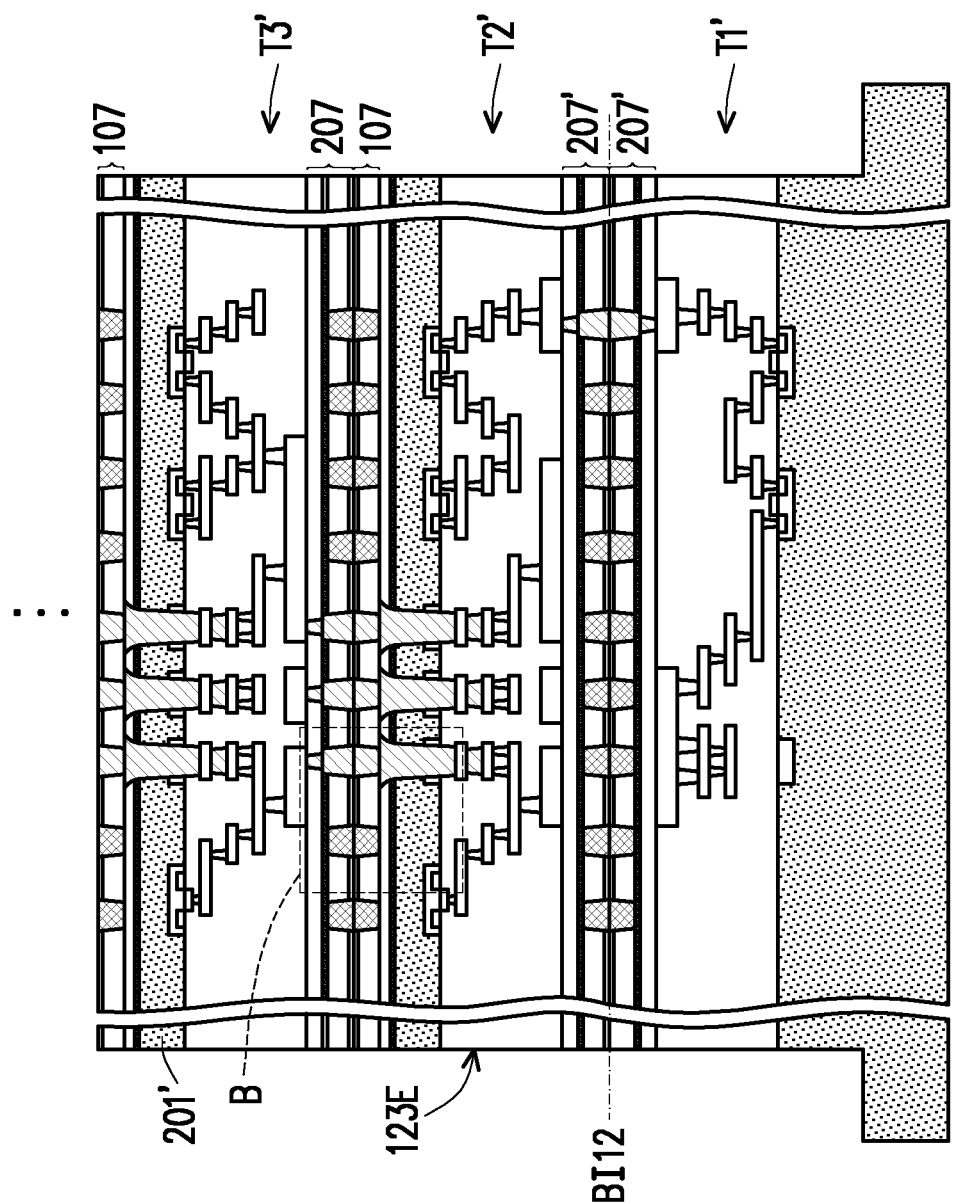
Figure 6D:
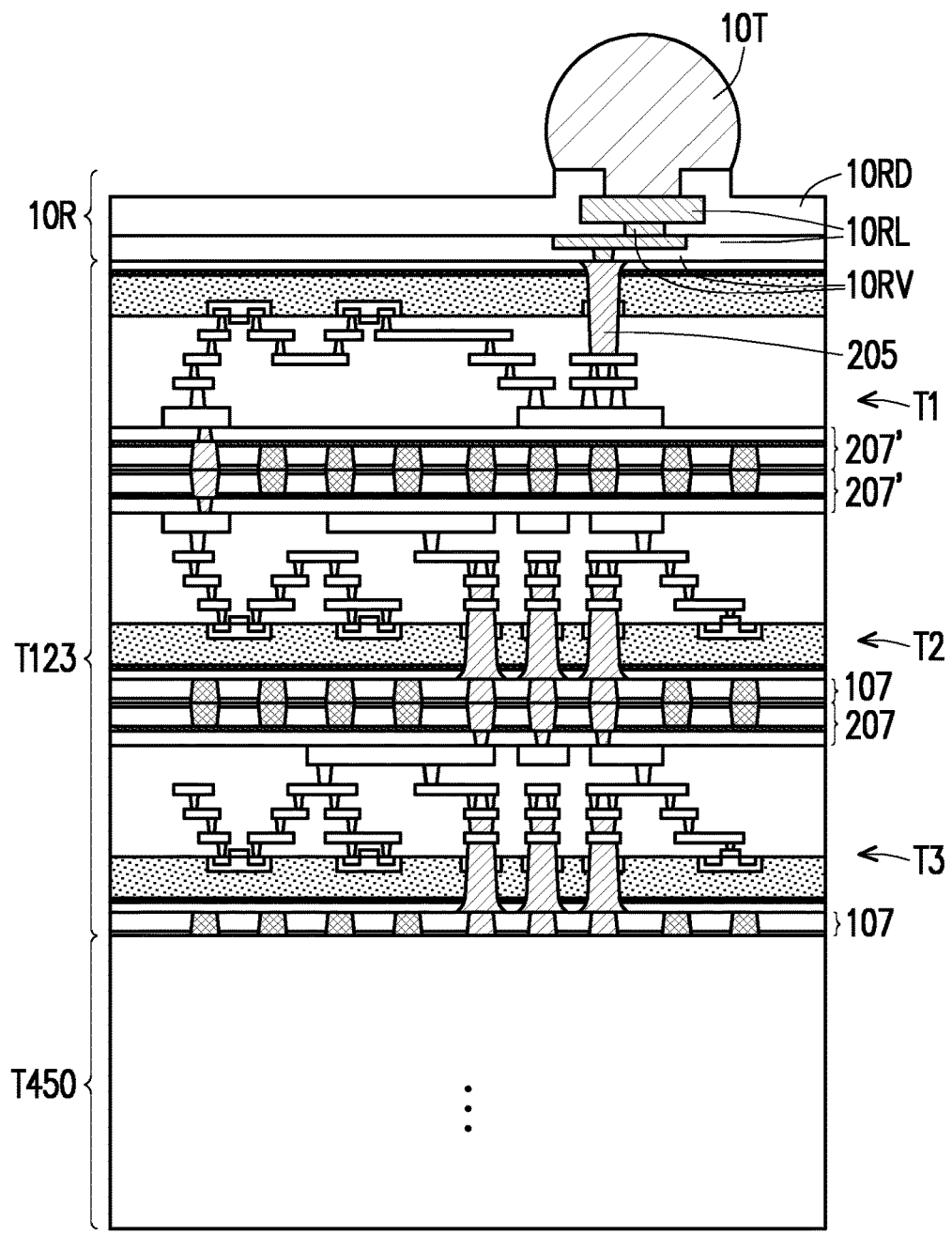
Figure 7:
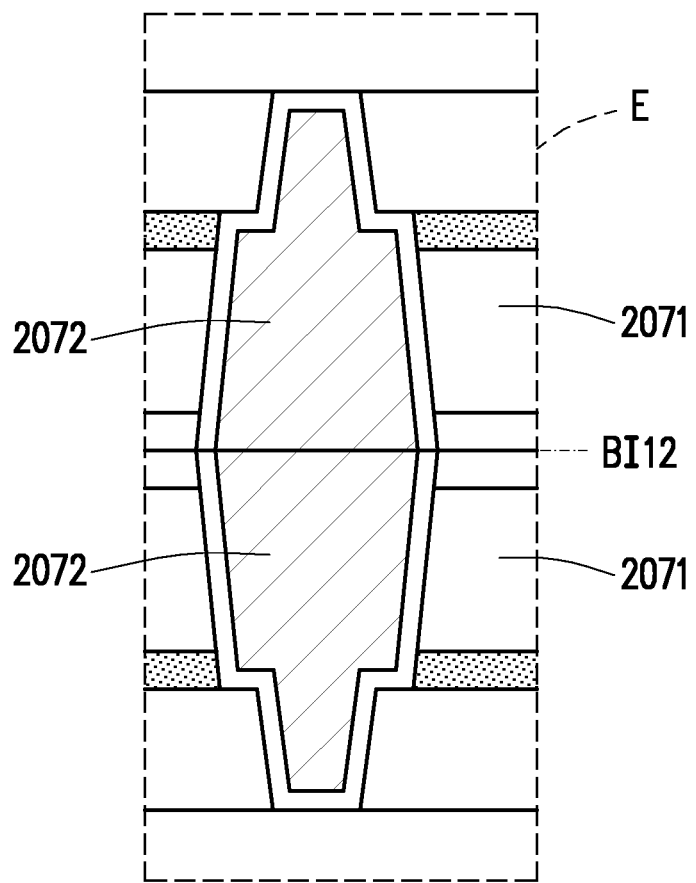
FIG. 7 is a schematic and enlarged cross-sectional view showing a dashed box E outlined in FIG. 6A according to some embodiments.

FIGS. 6A-6D are schematic cross-sectional views showing various stages in a manufacturing method of a semiconductor structure including a front-to-front bonding interface according to some embodiments, and FIG. 7 is a schematic and enlarged cross-sectional view showing a dashed box E outlined in FIG. 6A according to some embodiments. Unless specified otherwise, like reference numbers are used to designate like elements throughout the drawings.

Referring to FIG. 6A, two semiconductor wafers (T1' and T2') are bonded together in a front-to-front manner. For example, the respective semiconductor wafer (T1' and T2') includes the interconnect structure 204' formed on the semiconductor substrate 201' and the front-side bonding structure 207' formed on the interconnect structure 204'. The semiconductor substrate 201', the interconnect structure 204', and the front-side bonding structure 207' may be similar to the semiconductor substrate 201, the interconnect structure 204, and the front-side bonding structure 207 of the semiconductor wafer T5 described in FIG. 1E, respectively. During the bonding process, the front-side bonding structures 207' of the semiconductor wafers (T1' and T2') may be aligned and bonded together, where the bonding process may be similar to the process described in FIG. 1F. The temporary carrier for support may be unnecessary during the bonding process, although one of the semiconductor wafers may be attached to the temporary carrier according to other embodiments.

With continued reference to FIG. 6A and also referring to FIG. 7, the bonding feature 2072 in the enlarged view of FIG. 7 is similar to the bonding feature 2072 shown in FIG. 2A, and thus the detailed descriptions are not repeated for the sake of brevity. As shown in FIG. 7, the bonding dielectric layers 2071 respectively in the semiconductor wafers (T1' and T2') are bonded together, and the dielectric-dielectric bonds (e.g., oxide-oxide bonds) may be formed at the bonding interface BI12. The bonding features 2072 are vertically bonded together to form metal-to-metal bonds (e.g., copper-copper bonds) and provide electrical connections between the semiconductor wafers (T1' and T2'). The bonded dummy features 2073 may be electrically floating.

Referring to FIG. 6B, the semiconductor substrate 201' of the semiconductor wafer T2' may be thinned and then the BTSVs 105 may be formed in the thinned semiconductor substrate 201'. Subsequently, the back-side bonding structure 107 including the bonding features 1072 and the dummy features 1073 laterally covered by the bonding dielectric layer 1071 may be formed over the thinned semiconductor substrate 201'. The back-side thinning process and the forming processes of the BTSVs 105 and the back-side bonding structure 107 may be similar to the processes described in FIGS. 1B-1D, and thus the detailed descriptions are omitted for the sake of brevity. In some embodiments, after the bonding, a trimming process (e.g., similar to the process described in FIG. 1H) is performed to remove an edge portion EP. After the trimming, the back-side bonding structure 107 may be formed on the trimmed wafer T12'.

Referring to FIG. 6C, additional semiconductor wafer(s) T3' may be stacked upon and bonded to the semiconductor wafer T2'. In some embodiments, the semiconductor wafer T3' is bonded to the semiconductor wafer T2' in a front-to-back manner. For example, the front-side bonding structure 207 of the semiconductor wafer T3' is bonded to the back-side bonding structure 107 of the semiconductor wafer T2', and the bonding process may be similar to the process described in FIG. 1F. The enlarged view in the dashed box B may refer to the descriptions related to FIG. 2B, and the details will not be redundantly described. In some embodiments, the semiconductor wafer T3' also includes the back-side bonding structure 107 formed over the semiconductor substrate 201' for bonding to another semiconductor wafer (e.g., T3') or a wafer stack (e.g., the trimmed wafer T45' shown in FIG. 1I or the trimmed wafer T451' shown in FIG. 4C). In some embodiments, the semiconductor wafer T3' is initially provided without trimmed edge, and after the semiconductor wafer T3' is bonded to the semiconductor wafer T2' of the trimmed wafer T12', the semiconductor wafer T3' may be trimmed to form the trimmed and conterminous sidewall 123E. In some embodiments, the back-side bonding structure 107 of the semiconductor wafer T3' is formed after the trimming. Alternatively, the semiconductor wafer T3' may be omitted.

Referring to FIG. 6D and with continued to reference FIG. 6C, a semiconductor structure 40 including a die stack 40D is provided. The die stack 40D may include the first stack T123 and the second stack T450 coupled to the first stack T123. The second stack T450 may be the second stack T45 shown in FIG. 1J or may be replaced with the second stack T445 shown in FIG. 3 or the second stack T451 shown in FIG. 4D. It should be understood that the illustration of the first stack T123 including three tiers (T1, T2, and T3) is for illustrative purpose only, and the number of tiers in the first stack construes no limitation in the disclosure. For example, after forming the wafer stack as shown in FIG. 6C, the wafer stack and another wafer stack (e.g., the trimmed wafer T45' shown in FIG. 1I or the trimmed wafer T451' shown in FIG. 4C) are bonded in a front-to-back (or back-to-front) manner. Next, the BTSV 205 may be formed in the semiconductor substrate of the semiconductor wafer T1'. The formation of the BTSV 205 may be similar to that of the BTSV 105 described in FIG. 1C. The redistribution structure 10R and the conductive terminals 10T may be sequentially formed over the semiconductor wafer T1', where the conductive terminals 10T are electrically coupled to the BTSV 205 through the redistribution structure 10R. Afterwards, the singulation process may be performed to form a plurality of semiconductor structures 40.

Figure 8A:
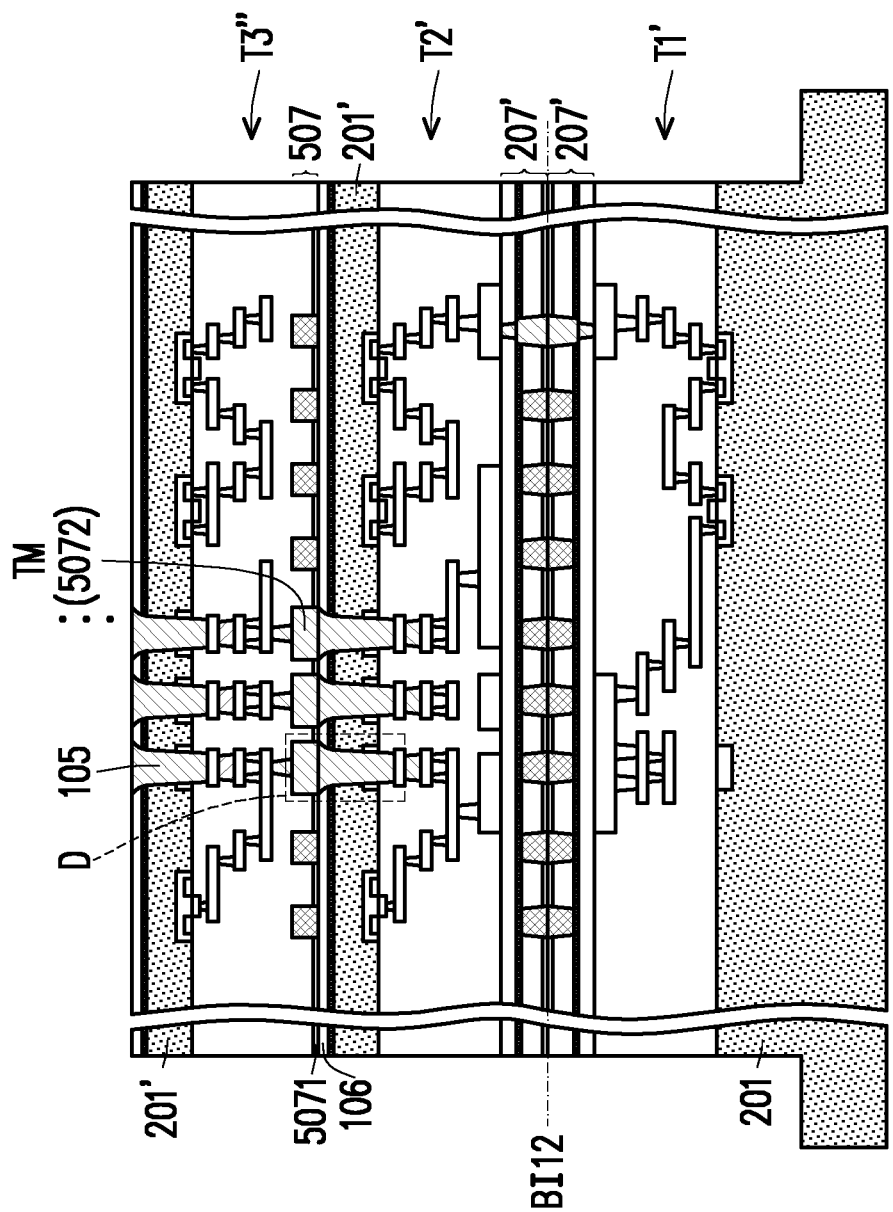
FIGS. 8A-8B are schematic cross-sectional views showing various stages in a manufacturing method of a semiconductor structure including a front-to-front bonding interface according to some embodiments.
Figure 8B:
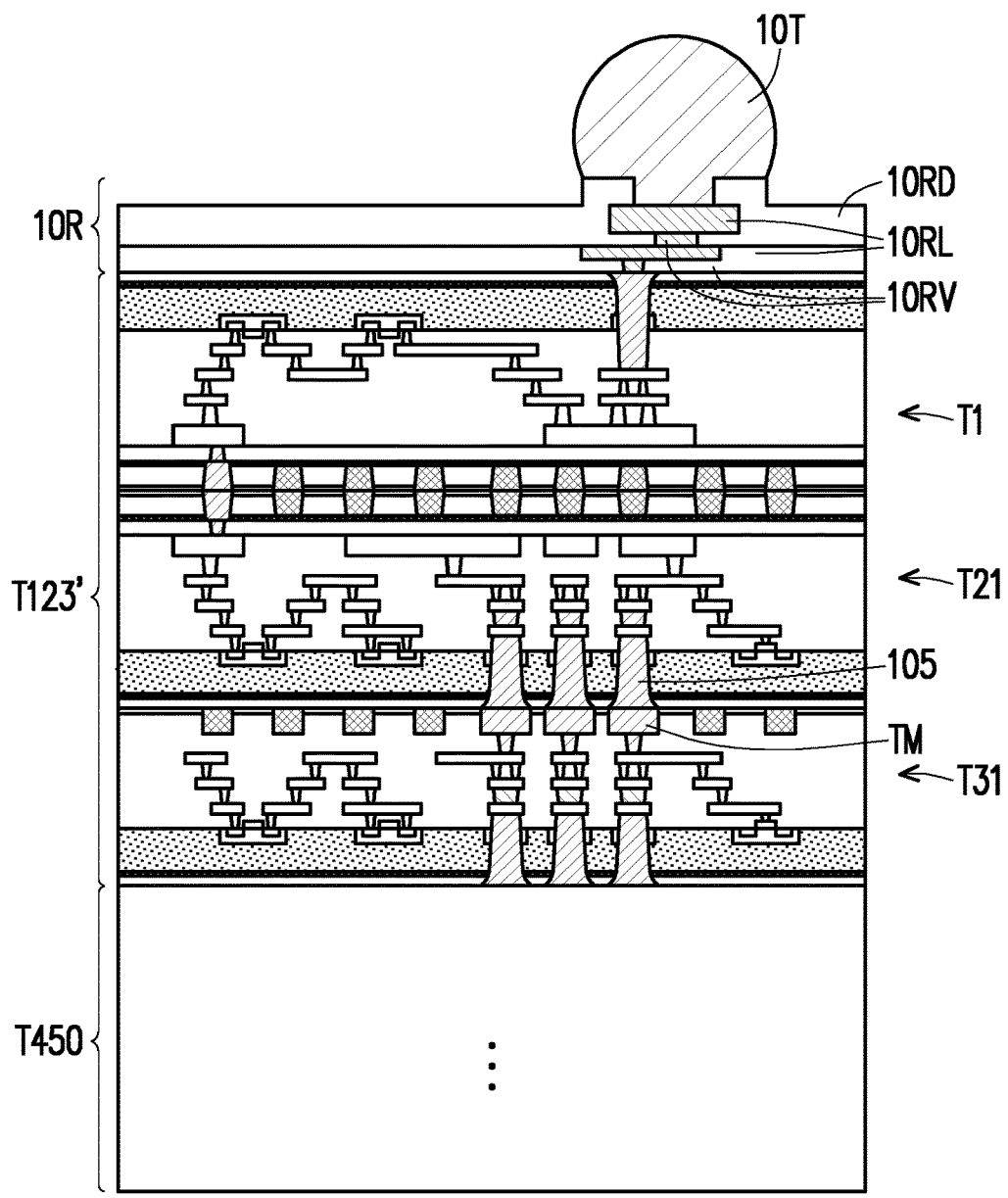

FIGS. 8A-8B are schematic cross-sectional views showing various stages in a manufacturing method of a semiconductor structure including a front-to-front bonding interface according to some embodiments. The manufacturing method shown in FIGS. 8A-8B may be similar to the manufacturing method shown in FIGS. 6A-6D. Unless specified otherwise, like reference numbers are used to designate like elements throughout the drawings.

Referring to FIG. 8A, the semiconductor wafers (T1' and T2') are bonded together, and the BTSVs 105 are formed in the thinned semiconductor substrate 201' of the semiconductor wafer T2'. Compared to the bonded wafer shown in FIG. 6B, the back-side bonding structure 107 is not formed on the thinned semiconductor substrate 201' of the semiconductor wafer T2' and may be omitted in the present embodiment. For example, the BTSVs 105 acting as the bonding features of the of the semiconductor wafer T2' are directly bonded to the bonding features 5072 of the front-side bonding structure 507 of the semiconductor wafer T3", where the metal patterns TM (e.g., conductive pads) at the top level of the interconnect layers may act as the bonding features. The dielectric layer 106 of the semiconductor wafer T2' may be bonded to the bonding dielectric layer 5071 of the front-side bonding structure 507 of the semiconductor wafer T3". The dummy features 5073 of the semiconductor wafer T3" are optionally formed in the bonding dielectric layer 5071.

The details regarding the bonding may be found in the discussion of the embodiments related to FIGS. 4A-4B. The enlarged view in the dashed box D may refer to the descriptions related to FIG. 5A (or may be replaced with the structure shown in FIG. 5B or FIG. 5C), and thus the details are not redundantly described. The semiconductor wafer T3" may include the BTSVs 105 formed in the thinned semiconductor wafer 201', and similarly, the BTSVs 105 of the semiconductor wafer T3" may function as the bonding features for bonding to another semiconductor wafer (e.g., T3") or a wafer stack (e.g., T451' shown in FIG. 4C). Alternatively, the semiconductor wafer T3" is omitted.

Referring to FIG. 8B, a semiconductor structure 45 including a die stack 45D is provided. The die stack 45D including the first stack T123' and the second stack T450 may be similar to the die stack 40D shown in FIG. 6D, except that the first stack T123' includes the BTSVs 105 of the tier T21 and the metal patterns TM of the tier T31 acting as the bonding features are physically bonded together. It should be understood that the illustration of the first stack T123' including three tiers (T1, T21, and T31) is for illustrative purpose only, the number of tiers in the first stack T123' construes no limitation in the disclosure.

Figure 9:
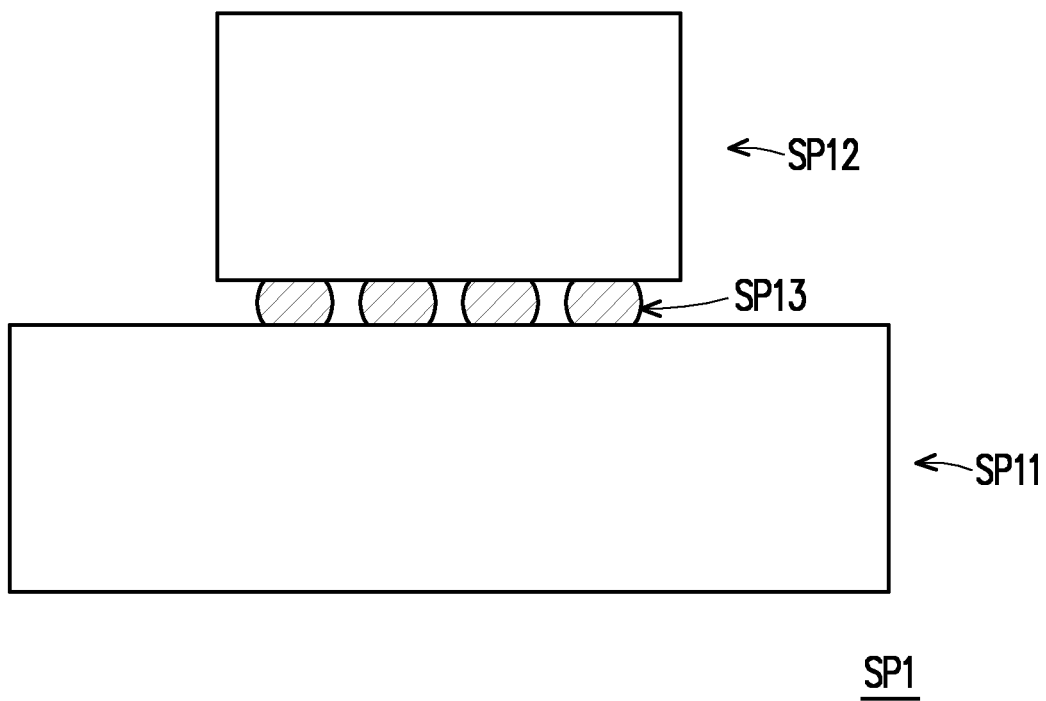
FIG. 9 is a schematic cross-sectional view showing an application of a semiconductor structure according to some embodiments.

FIG. 9 is a schematic cross-sectional view showing an application of a semiconductor structure according to some embodiments. Referring to FIG. 9, a semiconductor package SP1 including a first package component SP11 and a second package component SP12 disposed over the first package component SP11 is provided. The first package component SP11 may be or may include an interposer, a package substrate, a printed wiring board, a printed circuit board (PCB), and/or other carrier that is capable of carrying integrated circuits. The second package component SP12 mounted on the first package component SP11 may be or may include logic die (s), memory die (s), the like, combinations of these, etc. The second package component SP12 may be similar to any one of the semiconductor structures described in FIGS. 1J, 3, 4D, and 6D. In some embodiments, more than one the semiconductor structures (e.g., any combination of the semiconductor structures described above)

may be arranged side by side and electrically coupled to the first package component SP11 through a plurality of external terminals SP13. In some embodiments, the external terminals SP13 are the conductive terminals 10T described above. Alternatively, the external terminals SP13 are terminals (e.g., C4 bumps, solder balls, or BGA balls, etc.) having the sizes greater than the conductive terminals 10T, and a reflow process may be performed on the external terminals SP13 to couple the second package component SP12 to the first package component SP11.

The semiconductor structure described above may be or may be a part of an Integrated-Fan-Out package, a Chip-On-Wafer-On-Substrate package, a Chip-On-Wafer package, etc. For example, the second package component SP12 is the Integrated-Fan-Out package including at least one semiconductor structure (e.g., any one or any combination of the semiconductor structures described above) encapsulated by a molding layer (not shown). The second package component SP12 may further include a fan-out redistribution structure (not shown) formed on the molding layer and the semiconductor structure(s), where the fan-out redistribution structure may be electrically coupled to the semiconductor structures through the conductive terminals 10T. The external terminals SP13 of the second package component SP12 may be formed on the fan-out redistribution structure to provide vertical and electrical connection between the first package component SP11 and the semiconductor structures. Other packaging techniques may be used to form the semiconductor package SP1. The semiconductor package SP1 may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

Figure 10:
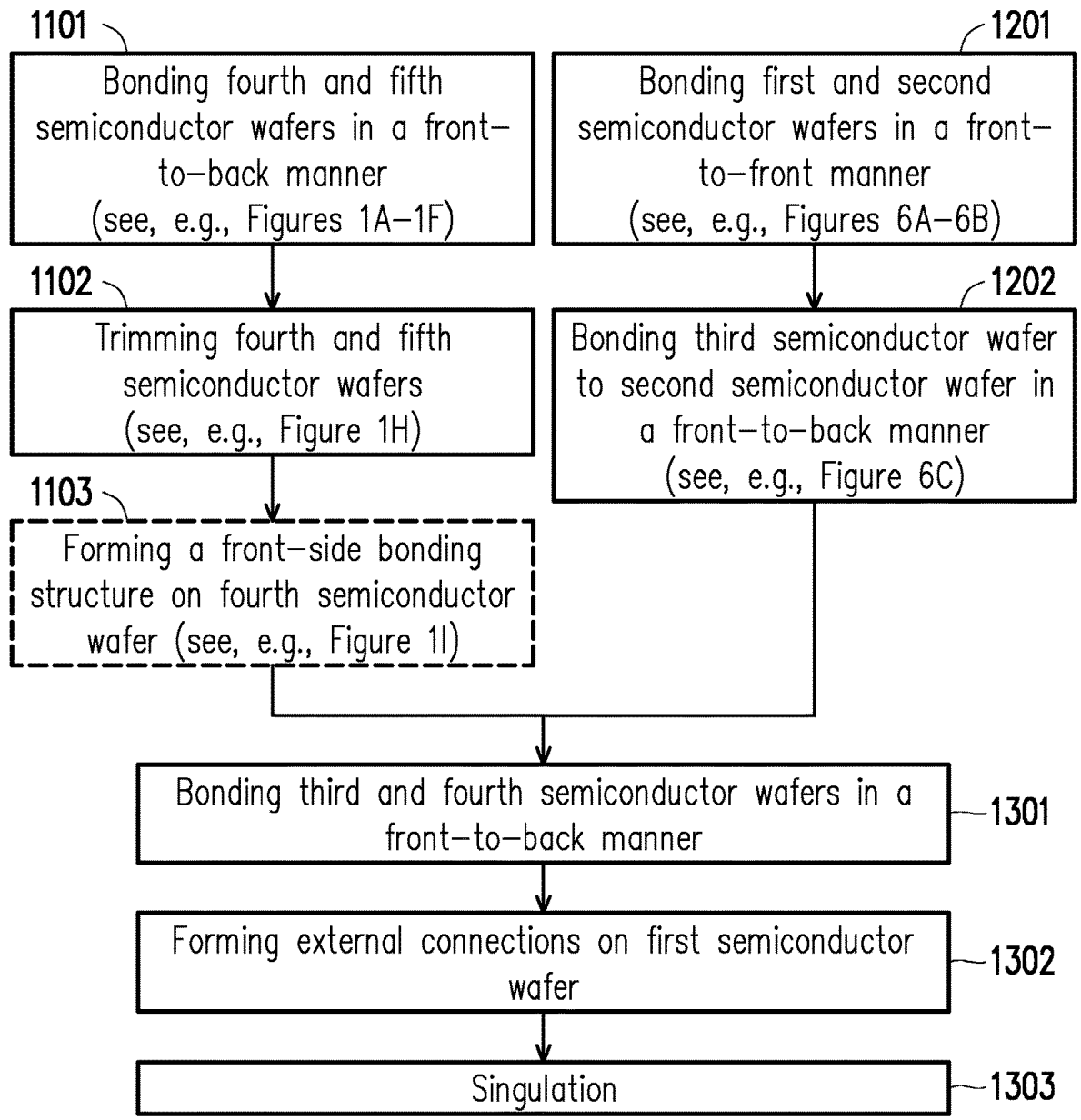
FIG. 10 is a flowchart illustrating a method for manufacturing a semiconductor structure according to some embodiments.

FIG. 10 is a flowchart illustrating a method for manufacturing a semiconductor structure according to some embodiments. It will be appreciated that although the method 1000 is illustrated and described below as a series of steps, the illustrated ordering of such steps are not to be interpreted in a limiting sense. For example, some steps occur in different orders and/or concurrently with other steps apart from those illustrated and/or described herein. In addition, not all illustrated steps may be required to implement one or more aspects or embodiments of the description herein. Further, one or more of the steps depicted herein may be carried out in one or more separate acts and/or phases.

Referring to FIG. 10, at the step 1101, the fourth and the fifth semiconductor wafers are bonded together in a front-to-back manner. For example, the front-side bonding structure of the fifth semiconductor wafer is bonded to the back-side bonding structure of the fourth semiconductor wafer. FIGS. 1A-1F (or FIGS. 4A-4B) show some embodiments corresponding to the step 1101. At the step 1102, after bonding the fourth and the fifth semiconductor wafers, the bonded wafer is trimmed to remove the edge portion. For example, FIGS. 1G-1H (or FIG. 4C) show some embodiments corresponding to the step 1102. At the step 1103, after trimming the bonded wafer, the front-side bonding structure is formed on the fourth semiconductor wafer of the wafer stack for further connection. For example, FIG. 1I shows some embodiments corresponding to the step 1102. In some embodiments, the step 1103 is skipped. Since the step 1103 is optional, the step 1103 is outlined in phantom in FIG. 10.

At the steps 1201-1202, the first and the second semiconductor wafers are bonded together in a front-to-front manner. For example, the front-side bonding structures of the first and the second semiconductor wafers are bonded to form the wafer stack. In some embodiments, after the bonding, a trimming process is performed to remove an edge portion of a bonded wafer. FIGS. 6A-6B show some embodiments corresponding to the steps 1101. Next, the third semiconductor wafer is bonded to the second semiconductor wafer in a front-to-back manner. FIG. 6C (or FIG. 8A) shows some embodiments corresponding to the step 1102. In some embodiments, the third semiconductor wafer is omitted.

At the steps 1301, 1302, and 1303, the third and the fourth semiconductor wafers are bonded together in a front-to-back manner. For example, the back-side bonding structure of the third semiconductor wafer and the front-side bonding structure of the fourth semiconductor wafer are bonded so that two wafer stacks are coupled together, where the fifth semiconductor wafer may be the bottommost wafer in the bonded wafer stack and the first semiconductor wafer may be the topmost wafer in the bonded wafer stack for further electrical connection. Next, external connections are formed on the first semiconductor wafer. For example, the BTSV(s) 205, the redistribution structure 10R, and the conductive terminals 10T (e.g., shown in FIG. 8B) are formed on the backside of the first semiconductor wafer. Afterwards, a singulation process is performed to cut through the redistribution structure 10R and the underlying bonded wafer stack to form a plurality of semiconductor structures (e.g., FIGS. 1J, 3, 4D, 6D, and 8B). For example, the semiconductor structures may be used to form the semiconductor package as described in FIG. 9.

In accordance with some embodiments, a semiconductor structure includes a top tier, a bottom tier, and a middle tier. The bottom tier includes a first interconnect structure overlying a first semiconductor substrate, and a first front-side bonding structure overlying the first interconnect structure. The middle tier is interposed between and electrically coupled to the top tier and the bottom tier. The middle tier includes a second interconnect structure overlying a second semiconductor substrate, a second front-side bonding structure interposed between the top tier and the second interconnect structure, and a back-side bonding structure interposed between the second semiconductor substrate and the first front-side bonding structure of the bottom tier. A first bonding feature of the second front-side bonding structure includes a first bonding via in contact with the second interconnect structure, a first bonding contact overlying the first bonding via, and a barrier layer interface between a bottom of the first bonding contact and a top of the first bonding via.

In accordance with some embodiments, a semiconductor structure includes a first stack and a second stack underlying and electrically coupled to the first stack. The second stack includes a first tier and a second tier interposed between and electrically coupled to the first stack and the first tier. The first tier includes a first interconnect structure overlying a first semiconductor substrate. The second tier includes a second interconnect structure overlying a second semiconductor substrate, and a first TSV extending through the second semiconductor substrate. The first TSV includes a first end bonded to a first metal pattern of the first interconnect structure of the first tier and a second end landing on a second metal pattern of the second interconnect structure.

In accordance with some embodiments, a manufacturing method of a semiconductor structure includes at least the following steps. A first semiconductor wafer is provided, where the first semiconductor wafer includes a back-side bonding structure overlying a first semiconductor substrate, a first interconnect structure underlying the first semiconductor substrate, and a bonding via connected to an interconnect layer of the first interconnect structure. A second semiconductor wafer is bonded to the first semiconductor wafer to form a bonded wafer, where the second semiconductor wafer includes a second semiconductor substrate, a first front-side bonding structure bonded to the back-side bonding structure of the first semiconductor wafer, a second interconnect structure interposed between the second semiconductor substrate and the first front-side bonding structure. The bonded wafer is trimmed. A bonding contact is formed on the bonding via of the first semiconductor wafer to form a second front-side bonding structure of the first semiconductor wafer after the removing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a top tier;
    a bottom tier, comprising a first semiconductor substrate and a first front-side bonding structure overlying the first semiconductor substrate; and
    a middle tier, between and electrically coupled to the top tier and the bottom tier, the middle tier comprising:
        a second semiconductor substrate; and
        a second front-side bonding structure overlying the second semiconductor substrate, a first bonding feature of the second front-side bonding structure comprising a first bonding via, a first bonding contact overlying the first bonding via, and a barrier layer interface between a bottom of the first bonding contact and a top of the first bonding via.

2. The semiconductor structure of claim 1, wherein the middle tier further comprises:
    a first through substrate via (TSV) extending through the second semiconductor substrate, the first TSV comprising a first surface connected to a back-side bonding structure of the middle tier and a second surface connected to a second interconnect structure of the middle tier, wherein the first surface is wider than the second surface, the second interconnect structure is between the second semiconductor substrate and the second front-side bonding structure, and the back-side bonding structure is between the second semiconductor substrate and the first front-side bonding structure of the bottom tier.

3. The semiconductor structure of claim 1, wherein the middle tier further comprises a back-side bonding structure interposed between the second semiconductor substrate and the first front-side bonding structure of the bottom tier, and wherein:
    the first front-side bonding structure of the bottom tier comprises a second bonding feature which comprises a second bonding via in contact with the first interconnect structure, and a second bonding contact overlying the second bonding via; and
    the back-side bonding structure of the middle tier comprises a third bonding contact that is in direct contact with a first TSV of the middle tier and the second bonding contact of the bottom tier.

4. The semiconductor structure of claim 3, wherein a surface of the third bonding contact of the back-side bonding structure of the middle tier connected to a surface of the first TSV of the middle tier comprises a first lateral dimension less than a second lateral dimension of the surface of the first TSV of the middle tier.

5. The semiconductor structure of claim 1, wherein the middle tier further comprises a back-side bonding structure interposed between the second semiconductor substrate and the first front-side bonding structure of the bottom tier, and wherein:
    the first front-side bonding structure of the bottom tier comprises a first dummy feature; and
    the back-side bonding structure of the middle tier comprises a second dummy feature bonded to the first dummy feature of the bottom tier, wherein the second dummy feature is electrically floating.

6. The semiconductor structure of claim 1, wherein the middle tier further comprises a back-side bonding structure interposed between the second semiconductor substrate and the first front-side bonding structure of the bottom tier, and wherein a bonding interface of the first front-side bonding structure of the bottom tier and the back-side bonding structure of the middle tier comprises a metal-to-metal bond and a dielectric-to-dielectric bond.

7. The semiconductor structure of claim 1, wherein the top tier comprises:
    a third interconnect structure underlying a third semiconductor substrate;
    a third front-side bonding structure underlying the third interconnect structure and facing the middle tier; and
    a second TSV extending through the third semiconductor substrate to be coupled to the third interconnect structure, wherein a portion of the second TSV protruded from the third semiconductor substrate comprises a curved sidewall in a cross-sectional view.

8. A semiconductor structure, comprising:
    a first stack, comprising two or more than two stacking tiers; and
    a second stack, over and electrically coupled to the first stack, the second stack comprising:
        a first tier, comprising a first interconnect structure; and
        a second tier, between and electrically coupled to the first stack and the first tier, the second tier comprising:
            a second interconnect structure; and
            a first through substrate via, comprising a first end bonded to the first interconnect structure of the first tier and a second end landing on the second interconnect structure.

9. The semiconductor structure of claim 8, wherein the first end is in contact with a first conductive feature of the first interconnect structure, and the second end is in contact with a second conductive feature of the second interconnect structure, wherein a first lateral dimension of the first conductive feature of the first tier is greater than a second lateral dimension of the first end of the first TSV of the second tier.

10. The semiconductor structure of claim 9, wherein the first tier further comprises:
    a first bonding dielectric layer laterally covering the first conductive feature of the first interconnect structure, wherein a surface of the first bonding dielectric layer and a surface the first conductive feature are substantially level.

11. The semiconductor structure of claim 8, wherein the second tier further comprises:
a second bonding dielectric layer underlying a second semiconductor substrate of the second tier and laterally covering a portion of the first TSV protruded from the second semiconductor substrate, wherein a surface of the second bonding dielectric layer and a surface the first end of the first TSV are substantially level.

12. The semiconductor structure of claim 11, wherein the portion of the first TSV comprises a tapered sidewall having a curved shape in a cross-sectional view.

13. The semiconductor structure of claim 8, wherein a bonding interface of the first tier and the second tier comprises a metal-to-metal bond and a dielectric-to-dielectric bond.

14. The semiconductor structure of claim 8, wherein the first stack comprises:
a middle tier comprising a third semiconductor substrate disposed over the second stack, a third interconnect structure overlying the third semiconductor substrate, and a first front-side bonding structure overlying the third interconnect structure; and
an outermost tier comprising a second front-side bonding structure overlying and bonded to the first front-side bonding structure of the middle tier, a fourth interconnect structure overlying the second front-side bonding structure, and a fourth semiconductor substrate overlying the fourth interconnect structure.

15. A semiconductor structure, comprising:
a top stacking structure, comprising two or more than two inner tiers;
a bottom tier, comprising a first front-side bonding structure;
a middle tier, between and electrically coupled to the top stacking structure and the bottom tier, the middle tier comprising:
a second front-side bonding structure, bonded to the top stacking structure and comprising a first bonding feature comprising a first bonding via, a first bonding contact overlying the first bonding via, and a barrier layer interface between a bottom of the first bonding contact and a top of the first bonding via; and
a redistribution structure, over the top stacking structure, wherein the top stacking structure is between and electrically coupled to the redistribution structure and the middle tier.

16. The semiconductor structure of claim 15, wherein the middle tier further comprises:
a second semiconductor substrate;
a second interconnect structure, disposed over the second semiconductor substrate, the second interconnect structure being between the second front-side bonding structure and the second semiconductor substrate;
a back-side bonding structure, disposed over the second semiconductor substrate, the second semiconductor substrate being between the second interconnect structure and the back-side bonding structure; and
a plurality of first through substrate vias (TSVs), extending through the second semiconductor substrate, the first TSVs each comprising a first surface connected to the back-side bonding structure of the middle tier and a second surface connected to the second interconnect structure of the middle tier, wherein the first surface is wider than the second surface.

17. The semiconductor structure of claim 15,
wherein the middle tier further comprises:
a second semiconductor substrate;
a second interconnect structure, disposed over the second semiconductor substrate, the second interconnect structure being between the second front-side bonding structure and the second semiconductor substrate; and
a back-side bonding structure, disposed over the second semiconductor substrate, the second semiconductor substrate being between the second interconnect structure and the back-side bonding structure, and
wherein the bottom tier further comprises:
a first semiconductor substrate; and
a first interconnect structure, disposed over the first semiconductor substrate, the first interconnect structure being between the first front-side bonding structure and the first semiconductor substrate,
wherein the first front-side bonding structure comprises a second bonding feature comprising:
a second bonding via, in contact with the first interconnect structure; and
a second bonding contact, overlying the second bonding via,
wherein the back-side bonding structure of the middle tier comprises a third bonding contact that is in direct contact with a first TSV of the middle tier and the second bonding contact of the bottom tier.

18. The semiconductor structure of claim 17, wherein a surface of the third bonding contact of the back-side bonding structure of the middle tier connected to a surface of the first TSV of the middle tier comprises a first lateral dimension less than a second lateral dimension of the surface of the first TSV of the middle tier.

19. The semiconductor structure of claim 17, wherein the middle tier further comprises:
a second semiconductor substrate;
a second interconnect structure, disposed over the second semiconductor substrate, the second interconnect structure being between the second front-side bonding structure and the second semiconductor substrate; and
a back-side bonding structure, disposed over the second semiconductor substrate, the second semiconductor substrate being between the second interconnect structure and the back-side bonding structure, wherein the back-side bonding structure is between the second semiconductor substrate and the first front-side bonding structure of the bottom tier, and wherein:
the first front-side bonding structure of the bottom tier comprises a first dummy feature; and
the back-side bonding structure of the middle tier comprises a second dummy feature bonded to the first dummy feature of the bottom tier, wherein the second dummy feature is electrically floating.

20. The semiconductor structure of claim 17, wherein the middle tier further comprises:
a second semiconductor substrate;
a second interconnect structure, disposed over the second semiconductor substrate, the second interconnect structure being between the second front-side bonding structure and the second semiconductor substrate; and
a back-side bonding structure, disposed over the second semiconductor substrate, the second semiconductor substrate being between the second interconnect structure and the back-side bonding structure, wherein the back-side bonding structure is between the second semiconductor substrate and the first front-side bonding structure of the bottom tier, and wherein a bonding interface of the first front-side bonding structure of the bottom tier and the back-side bonding structure of the middle tier comprises a metal-to-metal bond and a dielectric-to-dielectric bond.

* * * * *